(12) United States Patent
Onuki et al.

(10) Patent No.: US 11,270,997 B2
(45) Date of Patent: Mar. 8, 2022

(54) MEMORY DEVICE

(71) Applicant: SEMICONDUCTOR ENERGY LABORATORY CO., LTD., Atsugi (JP)

(72) Inventors: Tatsuya Onuki, Kanagawa (JP); Yuki Okamoto, Kanagawa (JP); Hisao Ikeda, Kanagawa (JP); Shuhei Nagatsuka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/757,025

(22) PCT Filed: Nov. 19, 2018

(86) PCT No.: PCT/IB2018/059084
§ 371 (c)(1),
(2) Date: Apr. 17, 2020

(87) PCT Pub. No.: WO2019/106479
PCT Pub. Date: Jun. 6, 2019

(65) Prior Publication Data
US 2020/0343244 A1 Oct. 29, 2020

(30) Foreign Application Priority Data

Nov. 30, 2017 (JP) ............................. JP2017-229785

(51) Int. Cl.
*H01L 27/00* (2006.01)
*H01L 29/00* (2006.01)
(Continued)

(52) U.S. Cl.
CPC ........ *H01L 27/1052* (2013.01); *H01L 27/124* (2013.01); *H01L 27/1207* (2013.01);
(Continued)

(58) Field of Classification Search
CPC ............ H01L 27/1052; H01L 27/1225; H01L 27/1255; H01L 27/124; H01L 27/108;
(Continued)

(56) References Cited

U.S. PATENT DOCUMENTS 5,276,649 A  1/1994 Hoshita et al.
6,188,598 B1  2/2001 Mueller et al.
(Continued)

FOREIGN PATENT DOCUMENTS

DE  10244988  5/2003
JP  02-244485 A  9/1990
(Continued)

OTHER PUBLICATIONS

Yamazaki.S et al., "Research, Development, and Application of Crystalline Oxide Semiconductor", SID DIGEST '12 : SID International Symposium Digest of Technical Papers, Jun. 5, 2012, vol. 43, No. 1, pp. 183-186.

(Continued)

*Primary Examiner* — Nikolay K Yushin
(74) *Attorney, Agent, or Firm* — Fish & Richardson P.C.

(57) ABSTRACT

A novel memory device is provided. A first cell array including a plurality of memory cells and a second cell array including a plurality of memory cells are stacked. One of two bit lines of a first bit line pair is electrically connected to A memory cells of the first cell array, and the other of the two bit lines of the first bit line pair is electrically connected to D memory cells of the second cell array. One of two bit lines of a second bit line pair is electrically connected to B memory cells of the first cell array and F memory cells of the second cell array, and the other of the two bit lines of the second bit line pair is electrically connected to C memory (Continued)

cells of the first cell array and E memory cells of the second cell array. The first bit line pairs and the second bit line pairs are alternately provided.

12 Claims, 14 Drawing Sheets

(51) Int. Cl.
*H01L 27/105* (2006.01)
*H01L 27/12* (2006.01)
*H01L 29/786* (2006.01)

(52) U.S. Cl.
CPC ...... *H01L 27/1225* (2013.01); *H01L 27/1255* (2013.01); *H01L 29/7869* (2013.01); *H01L 29/78648* (2013.01)

(58) Field of Classification Search
CPC ........... H01L 27/1207; H01L 29/78648; H01L 29/7869; H01L 29/786; G11C 7/18; G11C 7/12; G11C 7/22; G11C 7/1006; G11C 7/1048; G11C 7/08; G11C 11/4097; G11C 11/4091; G11C 11/4094; G11C 11/4085; G11C 11/405
See application file for complete search history.

(56) References Cited

U.S. PATENT DOCUMENTS

| | | | |
|---|---|---|---|
| 6,327,169 B1 | 12/2001 | Choy | |
| 6,430,076 B1 | 8/2002 | Mueller et al. | |
| 6,711,050 B2* | 3/2004 | Sadakata | G11C 11/405 365/149 |
| 8,378,403 B2 | 2/2013 | Kato | |
| 8,541,846 B2 | 9/2013 | Saito | |
| 8,824,231 B2 | 9/2014 | Choi | |
| 9,990,965 B2* | 6/2018 | Atsumi | G11C 11/4091 |
| 2003/0151943 A1* | 8/2003 | Sadakata | G11C 11/405 365/149 |
| 2007/0121414 A1 | 5/2007 | Butler | |
| 2013/0155790 A1* | 6/2013 | Atsumi | G11C 11/4097 365/189.011 |
| 2015/0294710 A1 | 10/2015 | Onuki | |

FOREIGN PATENT DOCUMENTS

| | | |
|---|---|---|
| JP | 04-094569 A | 3/1992 |
| JP | 2013-145875 A | 7/2013 |
| JP | 2016-054282 A | 4/2016 |
| KR | 2016-0145069 A | 12/2016 |
| TW | 201337925 | 9/2013 |
| WO | WO-2001/024263 | 4/2001 |
| WO | WO-2013/049920 | 4/2013 |
| WO | WO-2015/155635 | 10/2015 |

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53. No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and Its Transistor Characteristics", ECS Journal of Solid State Science and Technology, Jul. 1, 2014, vol. 3, No. 9, pp, Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium.Gallium.Zinc Oxide", Jpn. J. Appl. Phys. (Japanese Journal of Applied Physics) , 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
International Search Report (Application No. PCT/IB2018/059084) dated Jan. 29, 2019.
Written Opinion (Application No. PCT/IB2018/059084) dated Jan. 29, 2019.

* cited by examiner

FIG. 9A1
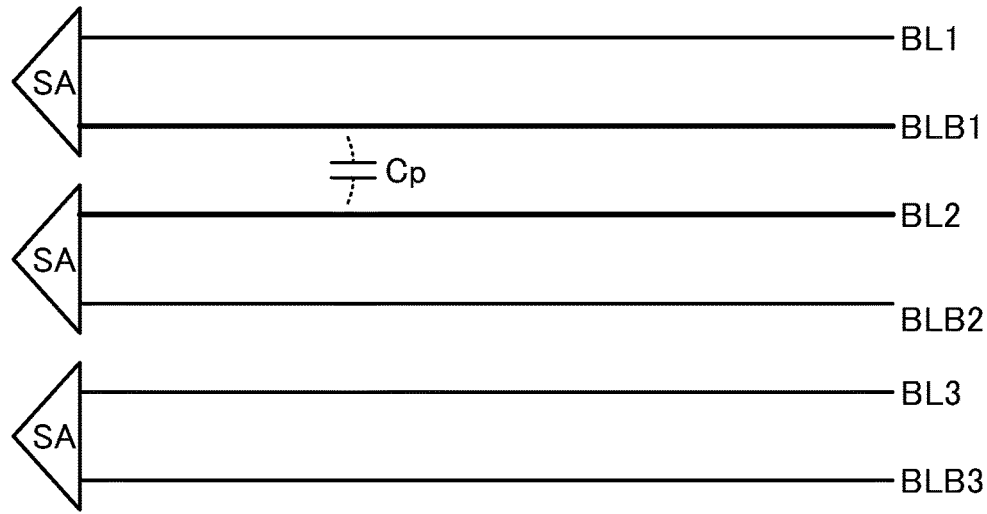
FIG. 9B1
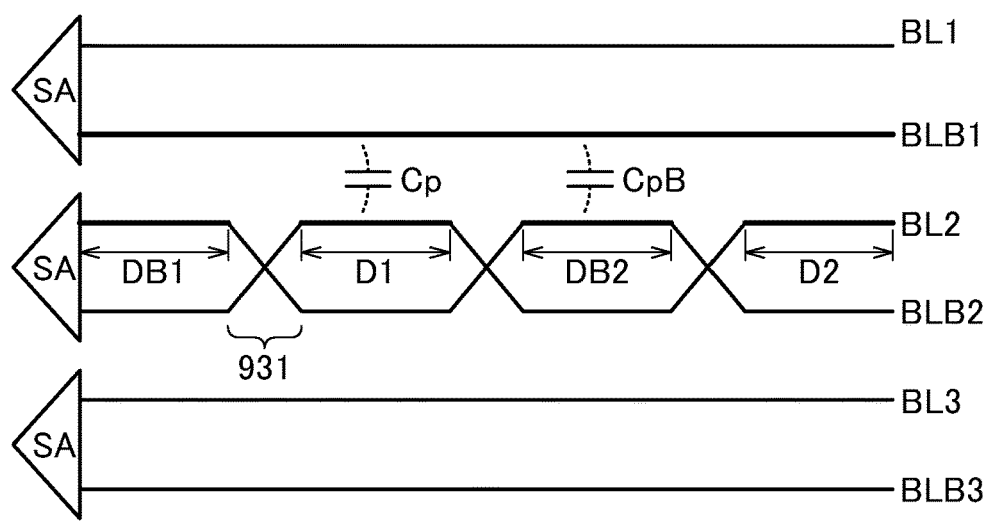
FIG. 9A2
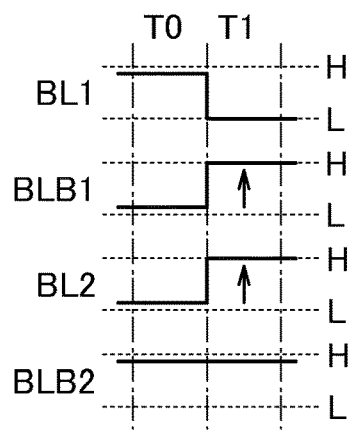
FIG. 9B2
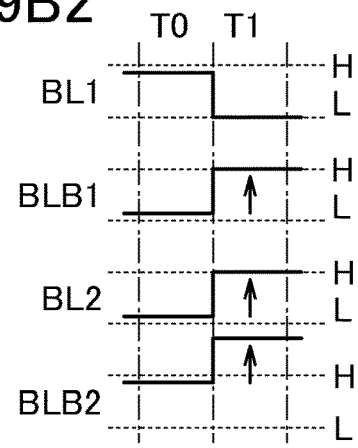

MEMORY DEVICE

CROSS REFERENCE TO RELATED APPLICATIONS

This application is a U.S. National Phase Application under 35 U.S.C. § 371 of International Application PCT/IB2018/059084, filed on Nov. 19, 2018, which claims the benefit of a foreign priority application filed in Japan on Nov. 30, 2017, as Application No. 2017-229785, both of which are incorporated by reference.

TECHNICAL FIELD

One embodiment of the present invention relates to a memory device, a semiconductor device, or an electronic device including either of these devices.

Note that one embodiment of the present invention is not limited to the above technical field. One embodiment of the invention disclosed in this specification and the like relates to an object, a method, or a manufacturing method. One embodiment of the invention disclosed in this specification and the like also relates to a process, a machine, manufacture, or a composition of matter.

In this specification and the like, a semiconductor device generally means a device that can function by utilizing semiconductor characteristics. A transistor and a semiconductor circuit are embodiments of semiconductor devices. A display device (e.g., a liquid crystal display device and a light-emitting display device), a projection device, a lighting device, an electro-optical device, a power storage device, a memory device, a semiconductor circuit, an imaging device, an electronic device, and the like may be referred to as a semiconductor device. Alternatively, they may include a semiconductor device.

BACKGROUND ART

Silicon-based semiconductor materials are widely known as materials for semiconductor thin films applicable to transistors; in addition, oxide semiconductors have attracted attention as alternative materials. Examples of oxide semiconductors include not only single-component metal oxides, such as indium oxide and zinc oxide, but also multi-component metal oxides. Among the multi-component metal oxides, in particular, an In-Ga—Zn oxide (hereinafter also referred to as IGZO) has been actively studied.

From the studies on IGZO, in an oxide semiconductor, a c-axis aligned crystalline (CAAC) structure and a nanocrystalline (nc) structure, which are not single crystal nor amorphous, have been found (see Non-Patent Documents 1 to 3). Non-Patent Documents 1 and 2 disclose a technique for forming a transistor using an oxide semiconductor having a CAAC structure. Moreover, Non-Patent Documents 4 and 5 disclose that a fine crystal is included even in an oxide semiconductor which has lower crystallinity than the CAAC structure and the nc structure.

In addition, a transistor which includes IGZO as an active layer has an extremely low off-state current (see Non-Patent Document 6), and an LSI and a display utilizing the characteristics have been reported (see Non-Patent Documents 7 and 8).

A dynamic random access memory (DRAM) is known as a kind of memory device. A DRAM includes a cell array in which a plurality of memory cells are arranged in a matrix, a plurality of bit lines, and a plurality of word lines. The memory cell is electrically connected to one of the plurality of bit lines and one of the plurality of word lines. The word line is supplied with a selection signal for selecting a memory cell on which data writing and data reading are performed. Data is written to and read from the memory cell through the bit line.

Therefore, when data is written to a memory cell X through a bit line A, for example, noise due to a potential change of the bit line A may be transmitted to a bit line B adjacent to the bit line A. In this case, data retained in a memory cell Y electrically connected to the bit line B is changed unintentionally in some cases. As a method for reducing the influence of such noise, a twisted bit-line method has been suggested (see Patent Document 1).

Note that DRAMs are classified into folded bit-line DRAMs and open bit-line DRAMs.

REFERENCE

Patent Document

[Patent Document 1] Japanese Published Patent Application No. H2-244485

Non-Patent Document

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

DISCLOSURE OF INVENTION

The twisted bit-line method can be employed in a folded bit-line memory device but cannot be employed in an open bit-line memory device in which memory cells are highly integrated; thus, a highly integrated cell array has been difficult to achieve.

An object of one embodiment of the present invention is to provide a highly-integrated memory device. Another object is to provide a memory device which is less likely to be affected by noise. Another object is to provide a memory device with high reliability. Another object is to provide a memory device with low power consumption. Another object is to provide a novel memory device. Another object is to provide a novel semiconductor device.

Note that the descriptions of these objects do not disturb the existence of other objects. In one embodiment of the present invention, there is no need to achieve all the objects.

Other objects will be apparent from and can be derived from the description of the specification, the drawings, the claims, and the like.

One embodiment of the present invention is a memory device including a first cell array, a second cell array, a first bit line pair, and a second bit line pair. The first cell array and the second cell array partly overlap with each other. The first cell array includes A first memory cells (A is an integer greater than or equal to 1), B first memory cells (B is an integer greater than or equal to 1), and C first memory cells (C is an integer greater than or equal to 1). The second cell array includes D second memory cells (D is an integer greater than or equal to 1), E second memory cells (E is an integer greater than or equal to 1), and F second memory cells (F is an integer greater than or equal to 1). One bit line of the first bit line pair is electrically connected to the A first memory cells. The other bit line of the first bit line pair is electrically connected to the D second memory cells. One bit line of the second bit line pair is electrically connected to the B first memory cells and the F second memory cells. The other bit line of the second bit line pair is electrically connected to the C first memory cells and the E second memory cells.

Another embodiment of the present invention is the memory device including a plurality of the first bit line pairs and a plurality of the second bit line pairs. The first bit line pairs and the second bit line pairs are alternately provided.

At least one of the first memory cells preferably includes a first transistor and a first capacitor and at least one of the second memory cells preferably includes a second transistor and a second capacitor.

The first transistor and the second transistor each preferably include an oxide semiconductor in a semiconductor layer. D is preferably more than or equal to 0.8 times and less than or equal to 1.2 times A. The sum of C and E is preferably more than or equal to 0.8 times and less than or equal to 1.2 times the sum of B and F.

According to one embodiment of the present invention, the twisted bit-line method can be employed in an open bit-line memory device.

According to one embodiment of the present invention, a highly-integrated memory device can be provided. Alternatively, a memory device which is less likely to be affected by noise can be provided. Alternatively, a memory device with high reliability can be provided. Alternatively, a memory device with low power consumption can be provided. Alternatively, a novel memory device can be provided. Alternatively, a novel semiconductor device can be provided.

Note that the descriptions of these effects do not disturb the existence of other effects. In one embodiment of the present invention, there is no need to achieve all the effects. Other effects will be apparent from and can be derived from the description of the specification, the drawings, the claims, and the like.

BRIEF DESCRIPTION OF DRAWINGS

In the accompanying drawings:

FIGS. 9A1 and 9B1 illustrate bit lines and sense amplifiers, and FIGS. 9A2 and 9B2 show the potential change of the bit lines;

BEST MODE FOR CARRYING OUT THE INVENTION

Figure 1A:
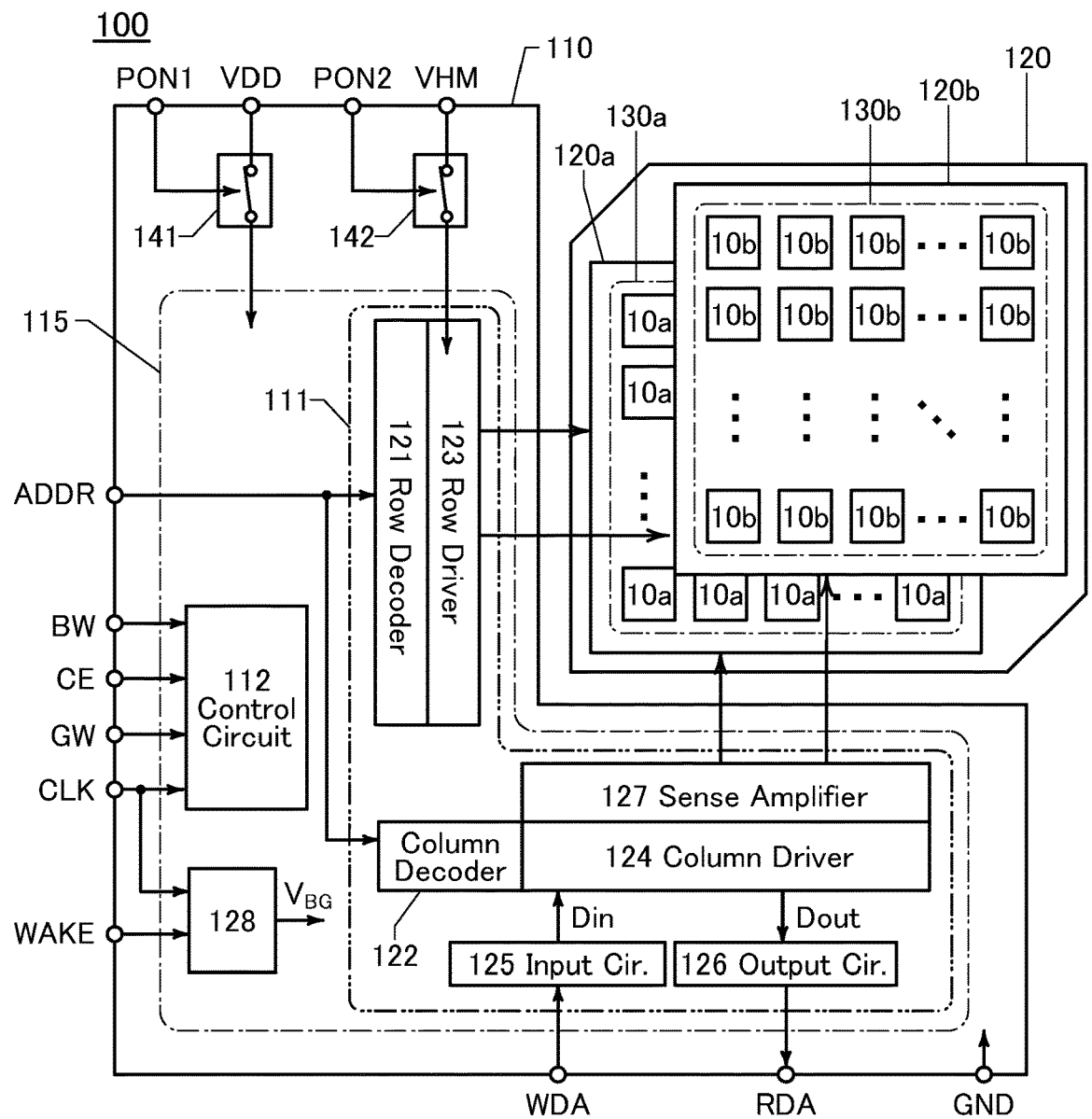
FIGS. 1A and 1B illustrate a structure example of a semiconductor device.

Embodiments are described in detail with reference to the drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" and "wirings" provided in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be interchanged with each other in this specification.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is disclosed in the drawings or the text.

In this specification and the like, the term "electrically connected" includes the case where components are connected through an "object having any electric function". There is no particular limitation on an "object having any electric function" as long as electric signals can be transmitted and received between components that are connected through the object. Thus, even when the expression "electrically connected" is used, there is a case where no physical connection is made and a wiring just extends in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter also referred to as an "effective channel width") is sometimes different from a channel width shown in a top view of a transistor (hereinafter also referred to as an "apparent channel width"). For example, in a transistor having a gate electrode covering side surfaces of a semiconductor layer, an effective channel width is greater than an apparent channel width, and its influence cannot be ignored in some cases. For example, in a miniaturized transistor having a gate electrode covering side surfaces of a semiconductor layer, the proportion of channel formation regions formed in the side surfaces of the semiconductor layer may be increased. In that case, an effective channel width is greater than an apparent channel width.

In such a case, an effective channel width is difficult to estimate by measuring in some cases. For example, to estimate an effective channel width from a design value, it is necessary to assume that the shape of a semiconductor is known. Therefore, in the case where the shape of a semiconductor is not known accurately, estimating an effective channel width accurately is difficult.

Thus, in this specification, an apparent channel width is referred to as a surrounded channel width (SCW) in some cases. Furthermore, in this specification, the simple term "channel width" may denote a surrounded channel width, an apparent channel width, or an effective channel width. Note that the values of a channel length, a channel width, an effective channel width, an apparent channel width, a surrounded channel width, and the like can be determined by analyzing a cross-sectional TEM image and the like.

A surrounded channel width may be used to calculate the field-effect mobility, the current value per channel width, and the like of a transistor. In this case, the obtained value is sometimes different from the value obtained by using an effective channel width for the calculation.

Note that impurities in a semiconductor refer to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor; specific examples are hydrogen, lithium, sodium, silicon, boron, phosphorus, carbon, and nitrogen. In the case of an oxide semiconductor, water also serves as an impurity in some cases. Furthermore, in the case of an oxide semiconductor, oxygen vacancies may be formed by entry of impurities. In the case where the semiconductor is silicon, examples of an impurity that changes the characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, the terms "identical", "the same", "equal", "uniform", and the like (including synonyms thereof) used in describing calculation values and actual measurement values allow for a margin of error of ±20%, unless otherwise specified.

In this specification and the like, in the case where an etching step is performed after a resist mask is formed by a photolithography method, the resist mask is removed after the etching step, unless otherwise specified.

In this specification and the like, a high power supply potential VDD (also referred to as "VDD" or "H potential") is a power supply potential higher than a low power supply potential VSS. The low power supply potential VSS (also referred to as "VSS" or "L potential") is a power supply potential lower than the high power supply potential VDD. In addition, a ground potential (also referred to as "GND" or "GND potential") can be used as VDD or VSS. For example, in the case where a ground potential is used as VDD, VSS is lower than the ground potential, and in the case where a ground potential is used as VSS, VDD is higher than the ground potential.

Note that the terms "film" and "layer" can be used interchangeably depending on the case or the circumstances. For example, the term "conductive layer" can be changed into the term "conductive film" in some cases. Also, for example, the term "insulating film" can be changed into the term "insulating layer" in some cases.

Furthermore, unless otherwise specified, transistors described in this specification and the like are enhancement-type (normally-off-type) field effect transistors. Unless otherwise specified, transistors described in this specification and the like are n-channel transistors. Thus, unless otherwise specified, the threshold voltage (also referred to as "Vth") is larger than 0 V.

Embodiment 1

A memory device of one embodiment of the present invention is described with reference to drawings.

First, a folded bit-line memory device and an open bit-line memory device are described.

Figure 8A:
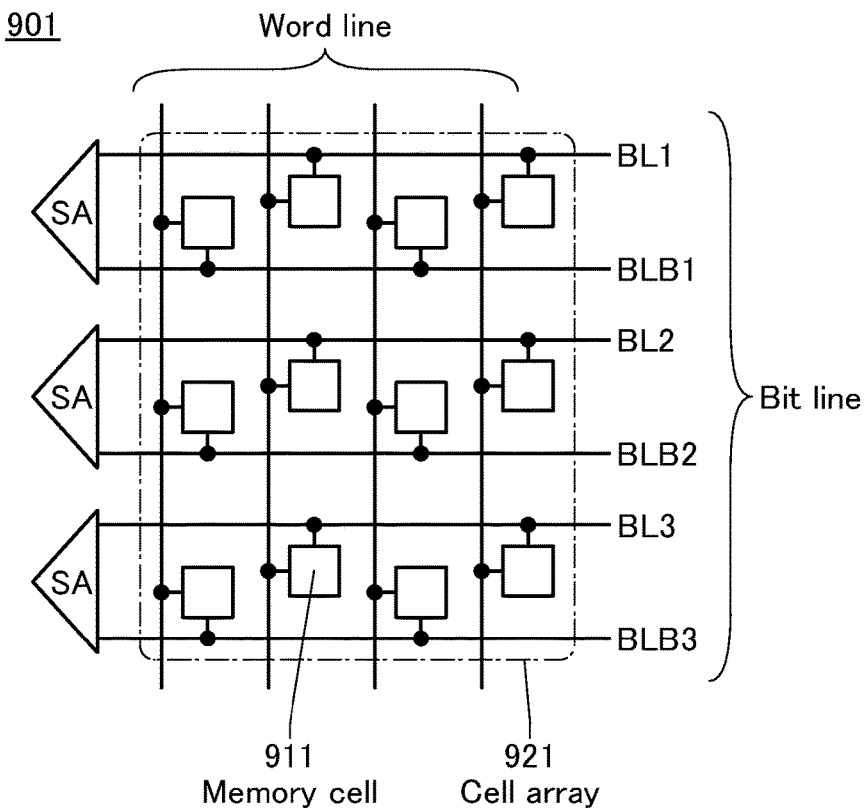
FIGS. 8A and 8B illustrate a folded bit-line memory device and an open bit-line memory device.

FIG. 8A is a block diagram illustrating a folded bit-line memory device 901. The memory device 901 includes a cell array 921 including memory cells 911 arranged in a matrix, a plurality of word lines, a plurality of bit lines, and a plurality of sense amplifiers SA. In the memory device 901, the plurality of bit lines extend in the row direction (or in the column direction), and the plurality of word lines extend in the column direction (or in the row direction).

The plurality of word lines each intersect with a plurality of bit line pairs. The plurality of bit lines include a plurality of bit lines BL and a plurality of bit lines BLB. FIG. 8A illustrates three bit lines BL (bit lines BL1 to BL3) and three bit lines BLB (bit lines BLB1 to BLB3).

In the folded bit-line memory device 901, the bit lines BL and the bit lines BLB are alternately provided. One bit line BL and one bit line BLB form one bit line pair. The memory device 901 includes a bit line pair formed by the bit line BL1 and the bit line BLB1, a bit line pair formed by the bit line BL2 and the bit line BLB2, and a bit line pair formed by the bit line BL3 and the bit line BLB3. One sense amplifier SA is electrically connected to one bit line pair.

The memory cell 911 is provided in the vicinity of an intersection point of the word line and the bit line. Note that the memory cell 911 electrically connected to the bit line BL of one bit line pair and the memory cell 911 electrically connected to the bit line BLB of the same bit line pair cannot be electrically connected to the same word line. For this reason, memory cells cannot be provided in the vicinity of all the intersection points in the folded bit-line memory device, which makes it difficult to achieve a highly integrated cell array.

Figure 8B:
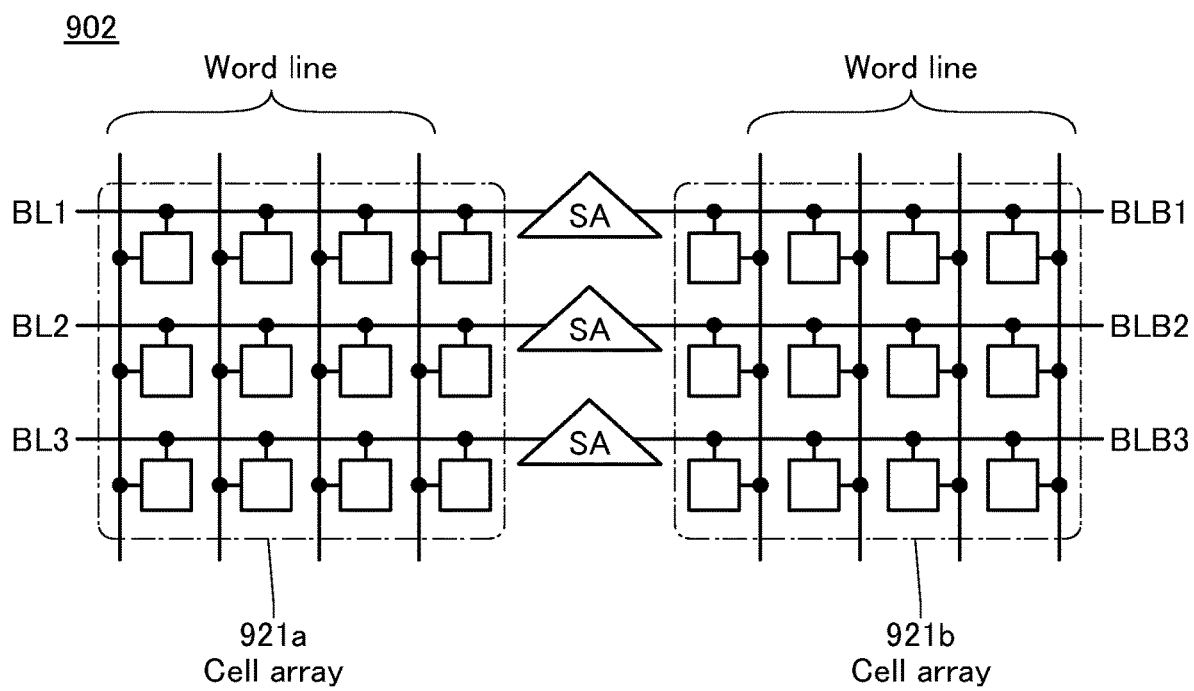

FIG. 8B is a block diagram illustrating an open bit-line memory device 902. In the open bit-line memory device 902, the bit lines BL are provided in a cell array 921a and the bit lines BLB are provided in a cell array 921b. A plurality of word lines are provided in each of the cell array 921a and the cell array 921b.

In the open bit-line memory device 902, memory cells can be provided in the vicinity of all the intersection points because the bit line BL and the bit line BLB are provided in different cell arrays and the word lines are provided in each cell array. This facilitates high integration of cell arrays.

Data retained in the memory cell 911 is read by the sense amplifier SA. When a specific memory cell 911 is selected by the word line, the data of the selected memory cell 911 is supplied to the bit line (bit line BL or bit line BLB), whereby the potential of the bit line changes. The sense amplifier SA amplifies and outputs a potential difference between the bit line BL and the bit line BLB.

FIG. 9A1 illustrates the bit lines and the sense amplifiers SA of the memory device 901. FIG. 9A2 is a timing chart showing the potential change of the bit lines.

The bit lines are capacitively coupled with each other through a parasitic capacitance. For example, a parasitic capacitance Cp exists between the bit line BLB1 and the bit line BL2. Thus, when the potential of the bit line BLB1 is inverted by data writing, the potential of the bit line BL2 adjacent to the bit line BLB1 may be also inverted.

The malfunction of the memory device 901 is described with reference to FIG. 9A2. In a period T0, the potential of each of the bit line BL1 and the bit line BLB2 is slightly lower than H potential and the potential of each of the bit line BLB1 and the bit line BL2 is slightly higher than L potential. When the bit line BLB1 is supplied with the H potential in a period T1, the potential of the bit line BL2 that is capacitively coupled with the bit line BLB1 through the parasitic capacitance Cp also increases and may become higher than the potential of the bit line BLB2. Since the sense amplifier SA amplifies a slight potential difference, wrong data is read from a bit line pair including the bit line BL2. That is, the potential change of the bit line BLB1 affects the bit line BL2 as noise.

The influence of the noise can be reduced by making the bit line BL2 and the bit line BLB2 intersect with each other. In this specification and the like, a bit line pair including an intersection point of the bit line BL and the bit line BLB is referred to as a "twisted bit line pair". FIG. 9B1 illustrates the bit lines and the sense amplifiers SA of the memory device 901 including a twisted bit line pair. FIG. 9B2 is a timing chart showing the potential change of the twisted bit line pair.

In FIG. 9B1, a bit line pair including the bit line BL2 and the bit line BLB2 is a twisted bit line pair. The twisted bit line pair illustrated in FIG. 9B1 includes three intersection points 931 and part of the bit line BL2 and part of the bit line BLB2 are adjacent to the bit line BLB1. Specifically, a region D1 and a region D2 of the bit line BL2 and a region DB1 and a region DB2 of the bit line BLB2 are adjacent to the bit line BLB1.

As described above, the parasitic capacitance Cp exists between the bit line BLB1 and the bit line BL2. A parasitic capacitance between the bit line BLB1 and the bit line BLB2 is denoted as a parasitic capacitance CpB. The capacitance value of the parasitic capacitance Cp is proportional to the total length of the region D1 and the region D2. Similarly, the capacitance value of the parasitic capacitance CpB is proportional to the total length of the region DB1 and the region DB2. The capacitance value of the parasitic capacitance Cp is preferably the same as the capacitance value of the parasitic capacitance CpB. Thus, the total length of the regions of the bit line BL2 that are adjacent to the bit line BLB1 (the total length of the region D1 and the region D2) is preferably the same as the total length of the regions of the bit line BLB2 that are adjacent to the bit line BLB1 (the total length of the region DB1 and the region DB2).

Note that, the capacitance value of the parasitic capacitance Cp is also proportional to the total number of memory cells connected to the region D1 and memory cells connected to the region D2. Similarly, the capacitance value of the parasitic capacitance CpB is also proportional to the total number of memory cells connected to the region DB1 and memory cells connected to the region DB2. Thus, the total number of the memory cells connected to the region D1 and the memory cells connected to the region D2 is preferably the same as the total number of the memory cells connected to the region DB1 and the memory cells connected to the region DB2.

The potential change of the twisted bit line pair is described with reference to FIG. 9B2. In a period T0, the potential of each of the bit line BL1 and the bit line BLB2 is slightly lower than H potential and the potential of each of the bit line BLB1 and the bit line BL2 is slightly higher than L potential. When the bit line BLB1 is supplied with the H potential in a period T1, the potential of the bit line BL2 that is capacitively coupled with the bit line BLB1 through the parasitic capacitance Cp increases. Moreover, the potential of the bit line BLB2 that is capacitively coupled with the bit line BLB1 through the parasitic capacitance CpB also increases. As described above, both of the potential of the bit line BL2 and the potential of the bit line BLB2 increase in the twisted bit line pair; therefore, a potential difference between those bit lines hardly changes even when affected by noise.

A folded bit-line memory device in which twisted bit line pairs and non-twisted bit line pairs are alternately provided is prevented from malfunctioning due to noise, and thus can have high reliability. On the contrary, an open-bit line memory device cannot include a twisted bit line pair because the bit line BL and the bit line BLB that form one bit line pair exist in different cell arrays on the same plane.

<<Memory Device 100>>

FIG. 1A is a block diagram illustrating a structure example of a memory device of one embodiment of the present invention. A memory device 100 illustrated in FIGS. 1A and 1B includes a layer 110 and a layer 120. The layer 120 includes a layer 120a and a layer 120b. In the memory device 100 of one embodiment of the present invention, the layer 120a and the layer 120b are stacked. The layer 120 may be stacked over the layer 110 (see FIG. 1B).

The layer 120a includes a cell array 130a. The cell array 130a includes a plurality of memory cells 10a arranged in a matrix. The layer 120b includes a cell array 130b. The cell array 130b includes a plurality of memory cells 10b arranged in a matrix. The cell array 130a and the cell array 130b partly overlap with each other.

<Layer 110>

The layer 110 includes a power switch (PSW) 141, a PSW 142, and a peripheral circuit 115. The peripheral circuit 115 includes a peripheral circuit 111, a control circuit 112, and a voltage generation circuit 128.

In the memory device 100, whether or not to use each circuit, each signal, and each potential can be selected as appropriate. Another circuit or another signal may be added. Signals BW, CE, GW, CLK, WAKE, ADDR, WDA, PON1, and PON2 are input signals, and a signal RDA is an output signal. The signal CLK is a clock signal.

The signals BW, CE, and GW are control signals. The signal CE is a chip enable signal. The signal GW is a global write enable signal. The signal BW is a byte write enable signal. The signal ADDR is an address signal. The signal WDA is a write data signal, and the signal RDA is a read data signal. The signals PON1 and PON2 are power gating control signals. Note that the signals PON1 and PON2 may be generated in the control circuit 112.

The control circuit 112 is a logic circuit having a function of controlling the entire operation of the memory device 100. For example, the control circuit performs a logical operation on the signals CE, GW, and BW to determine an operation mode (e.g., writing operation or reading operation) of the memory device 100. The control circuit 112 generates a control signal for the peripheral circuit 111 so that the operation mode is executed.

The voltage generation circuit 128 has a function of generating a negative voltage ($V_{BG}$). The negative voltage $V_{BG}$ is applied to a back gate of a transistor that is used for the memory cell 10. The signal WAKE has a function of controlling the input of CLK to the voltage generation circuit 128. For example, when an H-level signal is applied as the signal WAKE, the signal CLK is input to the voltage generation circuit 128, and the voltage generation circuit 128 generates $V_{BG}$.

The peripheral circuit 111 is a circuit for writing and reading data to/from the cell array 130a and the cell array 130b. The peripheral circuit 111 includes a row decoder 121, a column decoder 122, a row driver 123, a column driver 124, an input circuit 125, an output circuit 126, and a sense amplifier 127.

The row decoder 121 and the column decoder 122 have a function of decoding the signal ADDR. The row decoder 121 is a circuit for specifying a row to be accessed. The column decoder 122 is a circuit for specifying a column to be accessed. The row driver 123 has a function of selecting a word line connected to the memory cells 10 in the row specified by the row decoder 121. The column driver 124 has a function of writing data to the cell array 130a and the cell array 130b, reading data from the cell array 130a and the cell array 130b, retaining the read data, and the like.

The input circuit 125 has a function of retaining the signal WDA. Data retained in the input circuit 125 is output to the column driver 124. Data output from the input circuit 125 is data (Din) to be written to the cell array 130a and the cell array 130b. Data (Dout) read from the cell array 130a and the cell array 130b by the column driver 124 is output to the output circuit 126. The output circuit 126 has a function of retaining Dout. In addition, the output circuit 126 has a function of outputting Dout from the memory device 100. A data signal from the output circuit 126 is the signal RDA.

The PSW 141 has a function of controlling the supply of VDD to the peripheral circuit 115. The PSW 142 has a function of controlling the supply of VHM to the row driver 123. In the memory device 100, a high power supply voltage is VDD and a low power supply voltage is GND (ground potential). In addition, VHM, which is a high power supply voltage used for setting the word line to a high level, is higher than VDD. The on/off of the PSW 141 is controlled by the signal PON1, and the on/off of the PSW 142 is controlled by the signal PON2. The number of power domains to which VDD is supplied is one in the peripheral circuit 115 in FIG. 1A but can be plural. In this case, a power switch is provided for each power domain.

Figure 1B:
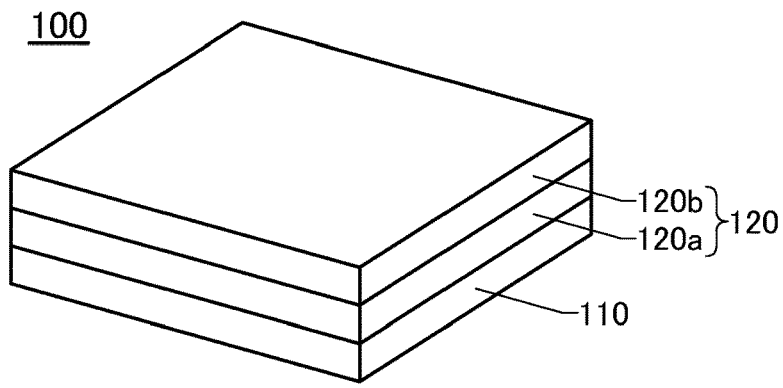
Figure 2:
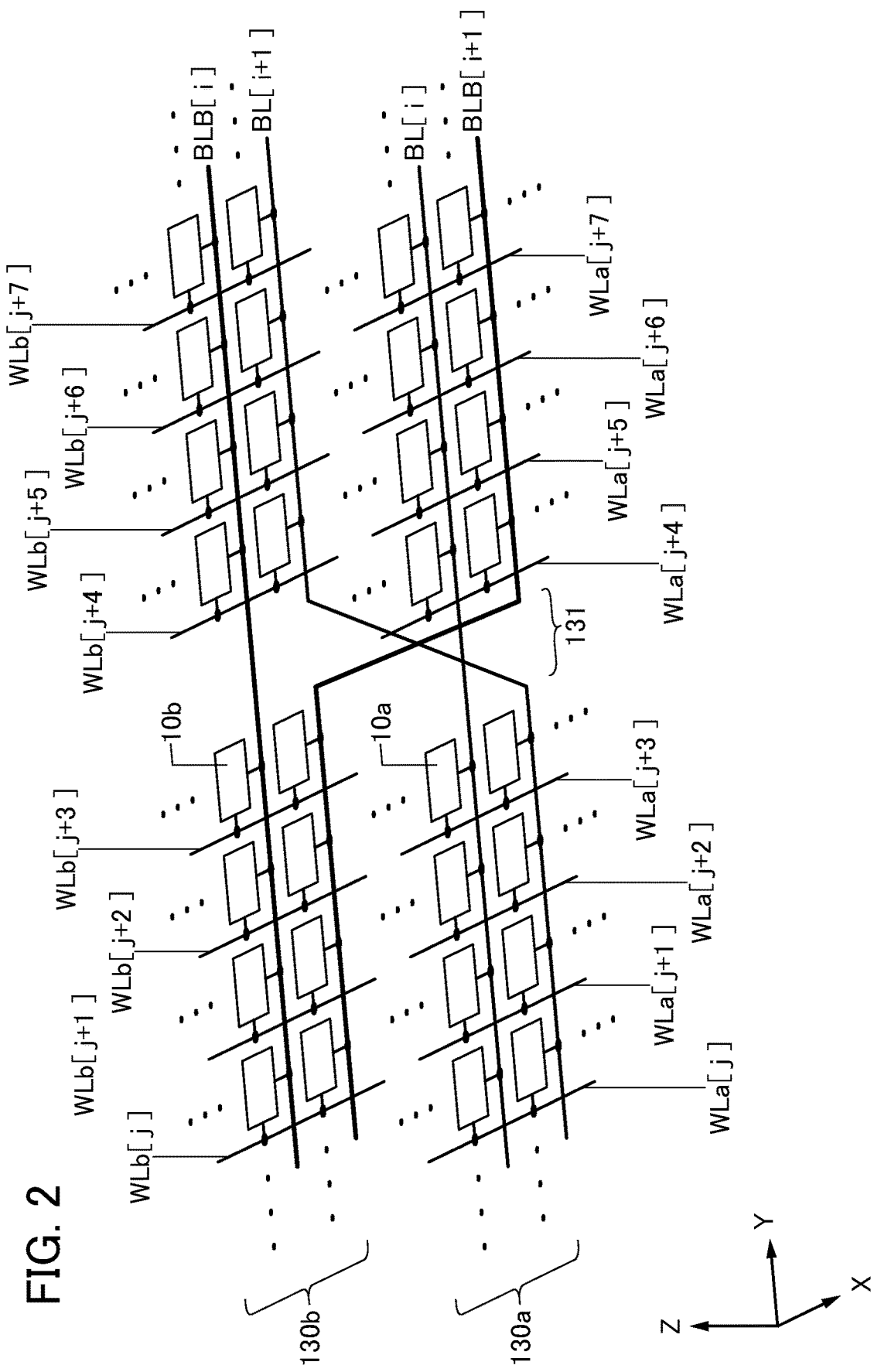
FIG. 2 illustrates a structure example of cell arrays.

The sense amplifier 127 includes a plurality of sense amplifiers SA (not illustrated in FIGS. 1A and 1B). One sense amplifier SA is electrically connected to one of bit line pairs described below and has a function of amplifying a potential difference between two bit lines included in the bit line pair. Specifically, the sense amplifier SA has a function of amplifying a difference between the potential of one bit line (i.e., a reference potential) and the potential of the other bit line.

<Layer 120>

The structure example of the layer 120 is described in detail with reference to FIG. 2. FIG. 2 is a perspective view illustrating the structures of the cell array 130a and the cell array 130b included in the layer 120. In FIG. 2, arrows indicating the X direction, the Y direction, and the Z direction are illustrated. The X direction, the Y direction, and the Z direction are orthogonal to each other.

The layer 120 includes the cell array 130a, the cell array 130b, N bit lines BL (N is an integer greater than or equal to 1) extending in the Y direction (column direction), and N bit lines BLB extending in the Y direction. In FIG. 2, the i-th bit line BL (i is an integer greater than or equal to 1 and less than or equal to N) is denoted as a bit line BL[i], and the i-th bit line BLB is denoted as a bit line BLB[i].

The layer 120 includes M word lines WLa (M is an integer greater than or equal to 1) extending in the X direction (row direction) and M word lines WLb extending in the X direction. The word lines WLa are provided in the cell array 130a and the word lines WLb are provided in the cell array 130b. In FIG. 2, the j-th word line WLa (1 is an integer greater than or equal to 1 and less than or equal to M) is denoted as a word line WLa[j], and the j-th word line WLb is denoted as a word line WLb[j].

The cell array 130a includes N×M memory cells 10a arranged in a matrix. The cell array 130b includes N×M memory cells 10b arranged in a matrix. The memory cell 10a is electrically connected to one of the word lines WLa. The memory cell 10b is electrically connected to one of the word lines WLb.

One bit line BL and one bit line BLB form one bit line pair. For example, the bit line BL[i] and the bit line BLB[i] form the i-th bit line pair. That is, the layer 120 includes N bit line pairs.

The N bit line pairs include a parallel bit line pair and a twisted bit line pair. In the cell array 130a and the cell array 130b, the parallel bit line pair is a bit line pair in which the bit line BL is provided in only one of the cell array 130a and the cell array 130b and the bit line BLB is provided in only the other of the cell array 130a and the cell array 130b. Thus, in the parallel bit line pair, the bit line BL is electrically connected to the memory cells 10a (10b) and the bit line BLB is electrically connected to the memory cells 10b (10a).

In the cell array 130a and the cell array 130b, the twisted bit line pair is a bit line pair in which the bit line BL and the bit line BLB each have a region provided in the cell array 130a and a region provided in the cell array 130b. Thus, in the twisted bit line pair, the bit line BL and the bit line BLB each have a region electrically connected to the memory cells 10a and a region electrically connected to the memory cells 10b.

When seen from the X direction, the twisted bit line pair includes a region (an intersection point 131) where the bit line BL and the bit line BLB intersect with each other between the cell array 130a and the cell array 130b. On the contrary, the parallel bit line pair does not include the intersection point 131 between the cell array 130a and the cell array 130b when seen from the X direction.

Figure 3A:
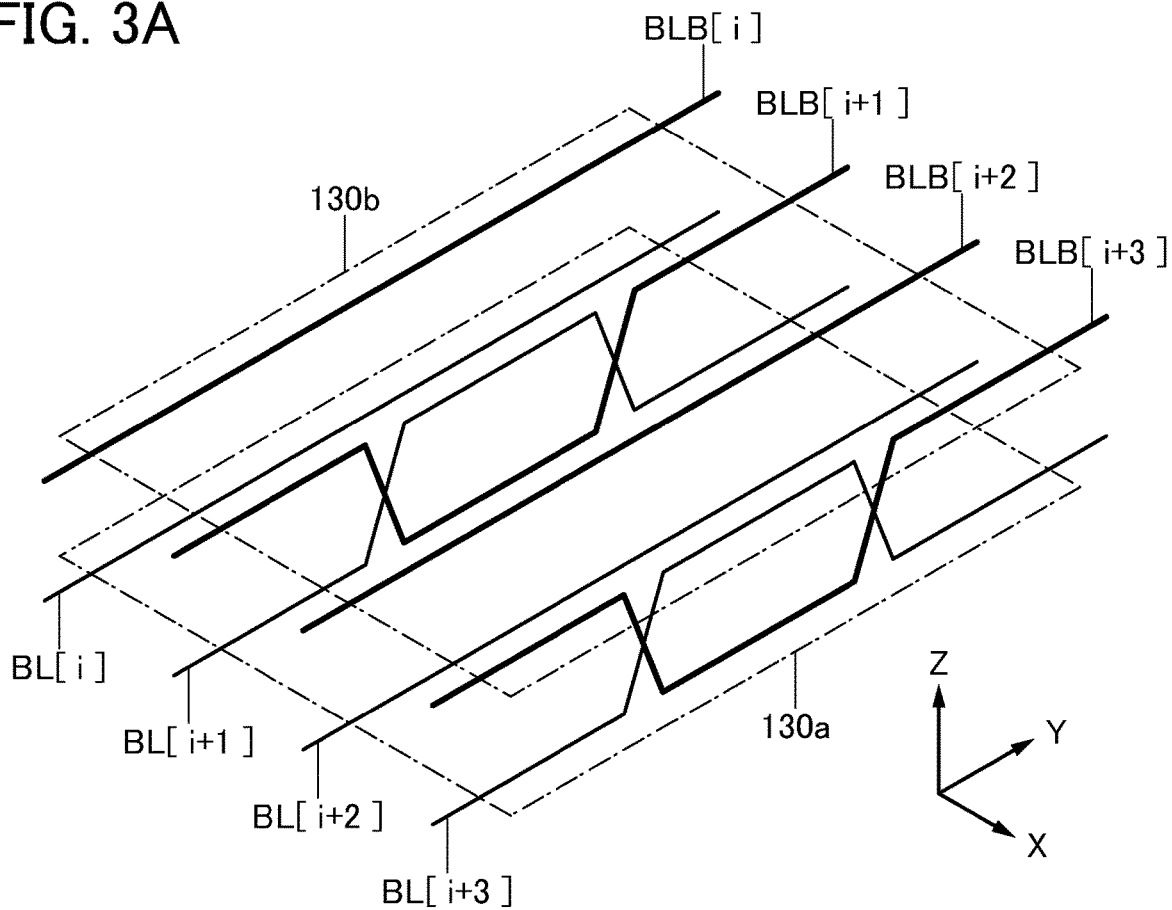
FIGS. 3A and 3B illustrate an arrangement example of bit line pairs.
Figure 3B:
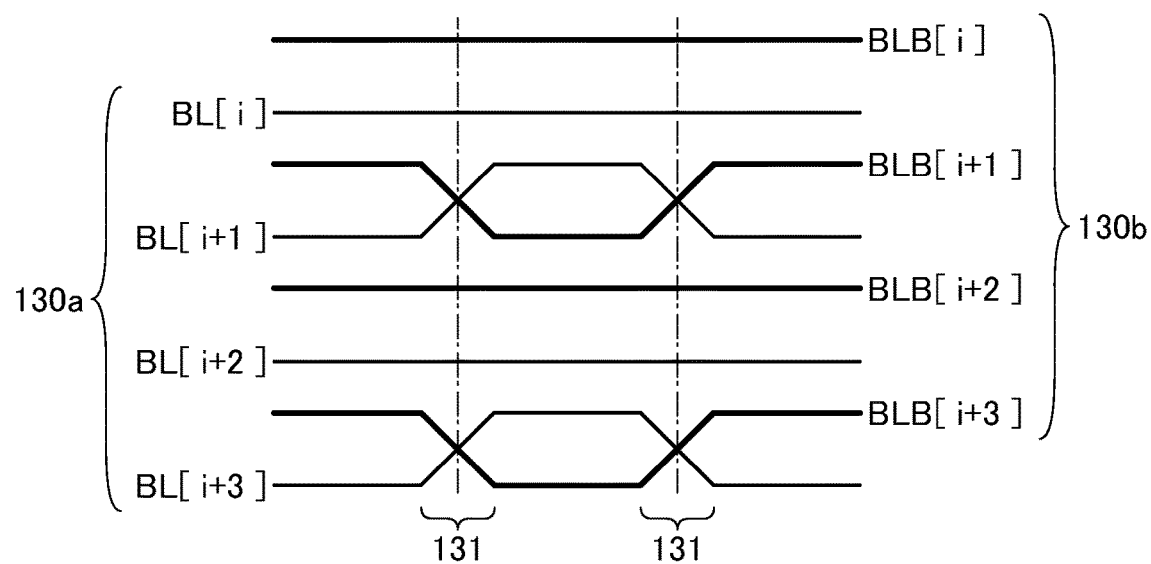

FIG. 3A is a perspective view illustrating an arrangement example of bit line pairs. FIG. 3B is a plan view for easy understanding of FIG. 3A. In FIGS. 3A and 3B, two parallel bit line pairs and two twisted bit line pairs are illustrated as an example. The parallel bit line pairs and the twisted bit line pairs are preferably alternately provided, in which case noise reduction effect can be enhanced.

Although the twisted bit line pair illustrated in FIGS. 3A and 3B includes two intersection points 131, the number of intersection points 131 in the twisted bit line pair may be one or more. The intersection points 131 of all the twisted bit line pairs are not necessarily aligned when seen from the X direction. The number of the intersection points 131 may be different among the twisted bit line pairs.

Figure 4A:
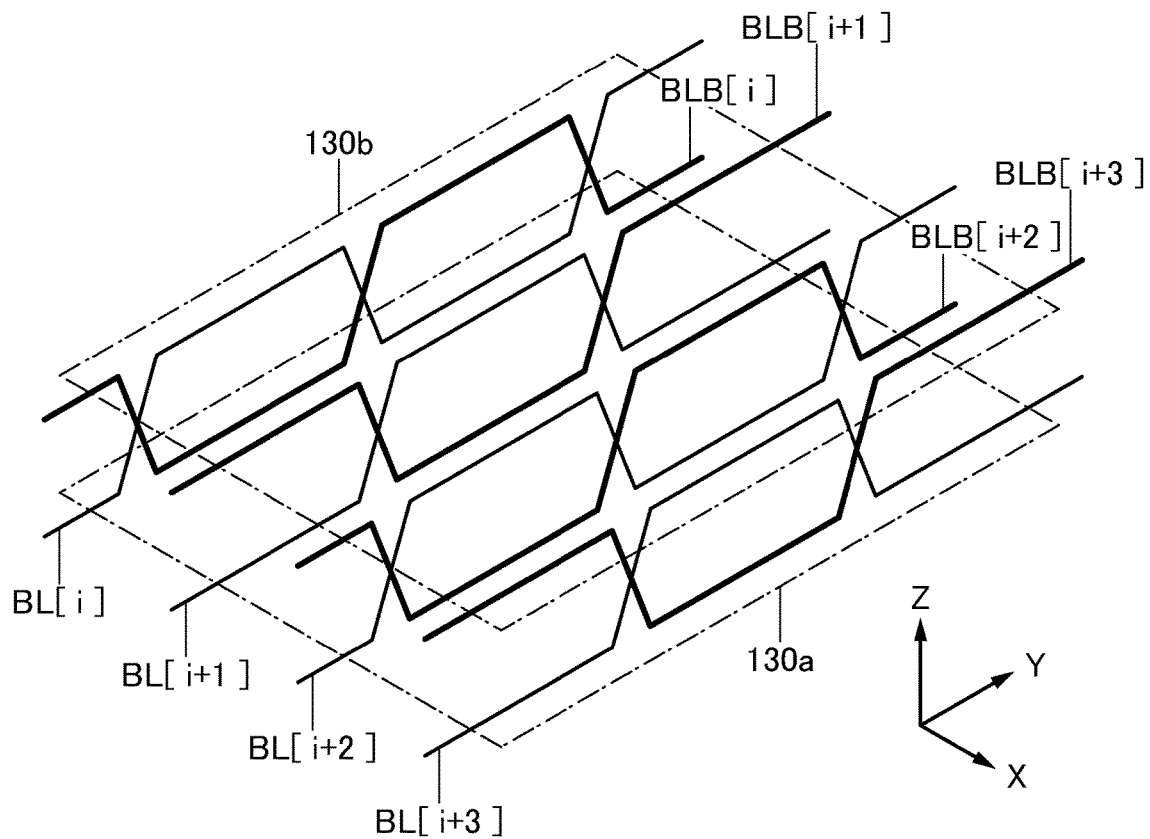
FIGS. 4A and 4B illustrate an arrangement example of bit line pairs.
Figure 4B:
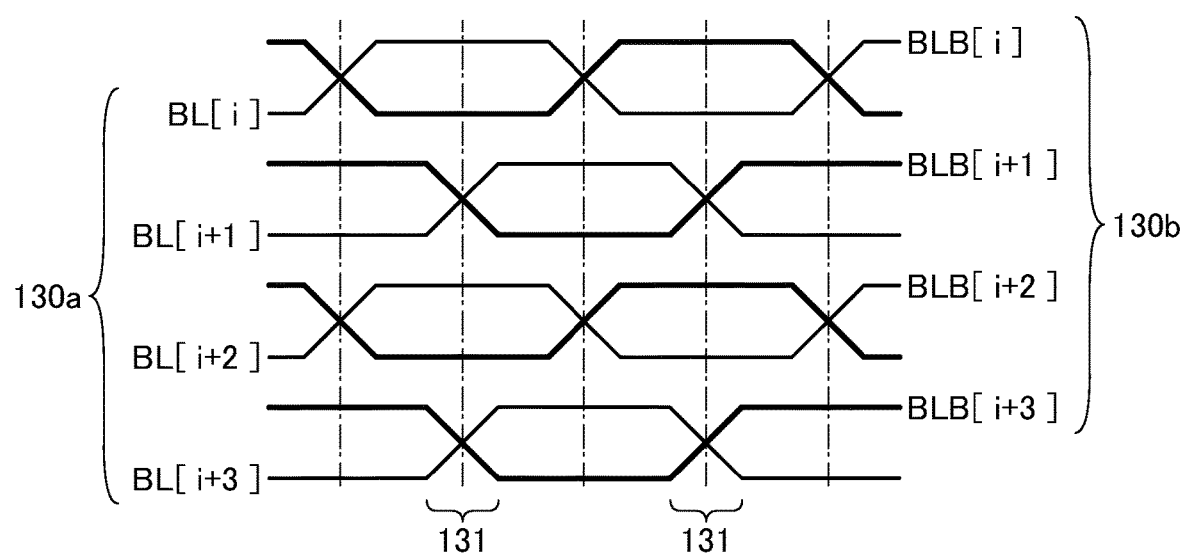

All the bit line pairs may be twisted bit line pairs. FIG. 4A is a perspective view illustrating an arrangement example in which all the bit line pairs are twisted bit line pairs. FIG. 4B is a plan view for easy understanding of FIG. 4A. In the case where all the bit line pairs are twisted bit line pairs, it is preferable that the intersection points 131 of adjacent bit line pairs do not overlap with each other when seen from the X direction.

Figure 5:
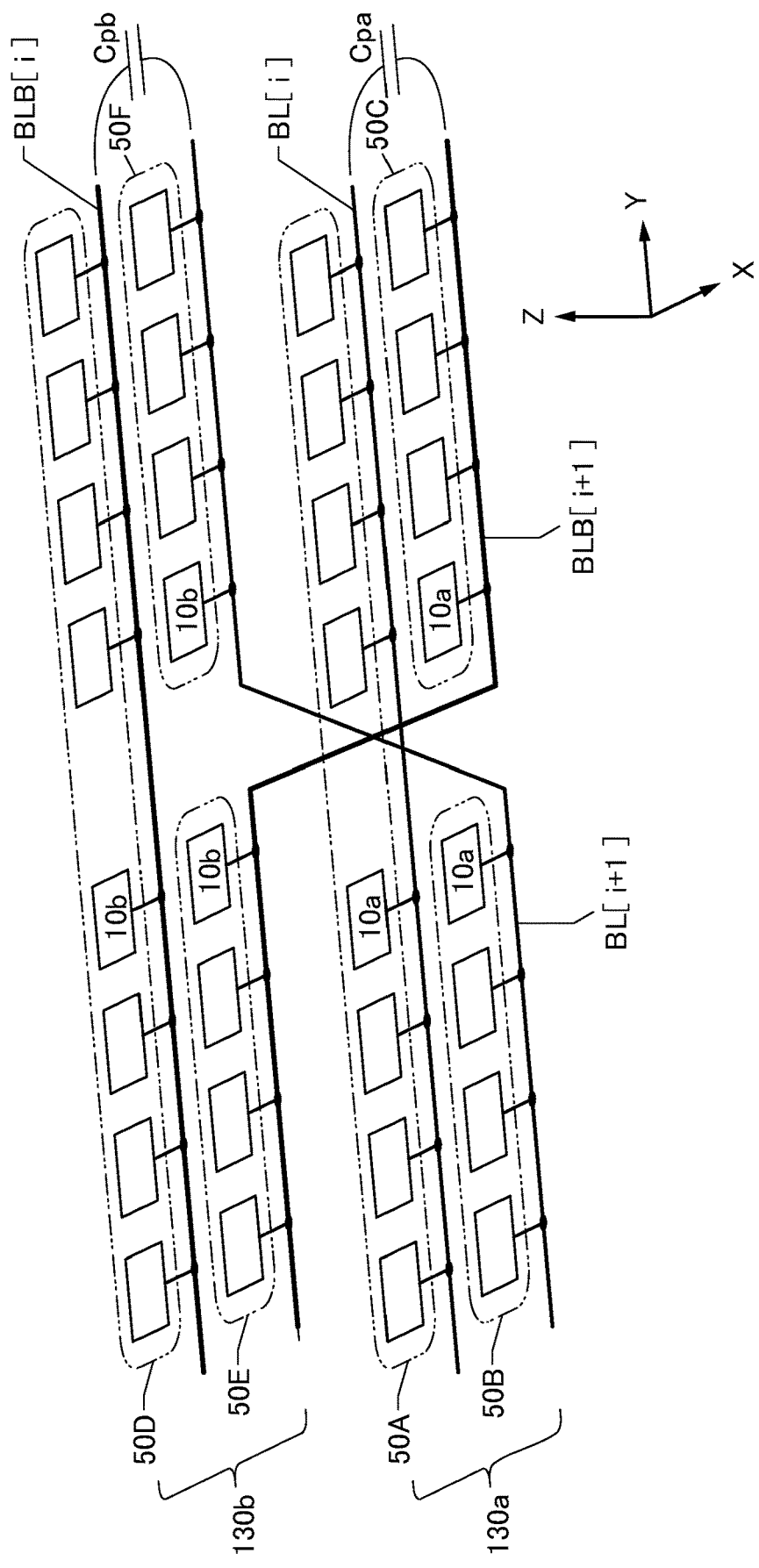
FIG. 5 illustrates memory cells electrically connected to bit lines.

The parasitic capacitance of the bit line BL and the parasitic capacitance of the bit line BLB change with the number of memory cells electrically connected to each of the bit lines. FIG. 5 is a perspective view illustrating the memory cells electrically connected to the bit lines. FIG. 5 illustrates part of each of the bit line BL[i], the bit line BLB[i], a bit line BL[i+1], and a bit line BLB[i+1]. The bit line BL[i] and the bit line BLB[i] form one parallel bit line pair and the bit line BL[i+1] and the bit line BLB[i+1] form one twisted bit line pair.

The cell array 130a in FIG. 5 includes a memory cell group 50A including A memory cells 10a (A is an integer greater than or equal to 1), a memory cell group 50B including B memory cells 10a (B is an integer greater than or equal to 1), and a memory cell group 50C including C memory cells 10a (C is an integer greater than or equal to 1).

The cell array 130b includes a memory cell group 50D including D memory cells 10b (D is an integer greater than or equal to 1), a memory cell group 50E including E memory cells 10b (E is an integer greater than or equal to 1), and a memory cell group 50F including F memory cells 10b (F is an integer greater than or equal to 1).

The bit line BL[i] is electrically connected to each of the A memory cells 10a of the memory cell group 50A. The bit line BLB[i] is electrically connected to each of the D memory cells 10b of the memory cell group 50D.

The bit line BL[i+1] is electrically connected to each of the B memory cells 10a of the memory cell group 50B and each of the F memory cells 10b of the memory cell group 50F.

The bit line BLB[i+1] is electrically connected to each of the E memory cells 10b of the memory cell group 50E and each of the C memory cells 10a of the memory cell group 50C.

Among parasitic capacitances generated between the parallel bit line pair and the twisted bit line pair, the capacitance value of a parasitic capacitance Cpa generated on the cell array 130a side is preferably the same as the capacitance value of a parasitic capacitance Cpb generated on the cell array 130b side. Specifically, the capacitance value of the parasitic capacitance Cpb is preferably more than or equal to 0.8 times and less than or equal to 1.2 times, further preferably more than or equal to 0.9 times and less than or equal to 1.1 times, still further preferably more than or equal to 0.95 times and less than or equal to 1.05 times the capacitance value of the parasitic capacitance Cpa. When the parasitic capacitance Cpa and the parasitic capacitance Cpb have the same or similar capacitance value, the influence of noise can be further reduced.

Therefore, A, which is the number of the memory cells 10a of the memory cell group 50A, is preferably the same as D, which is the number of the memory cells 10b of the memory cell group 50D. Specifically, D is preferably more than or equal to 0.8 times and less than or equal to 1.2 times, further preferably more than or equal to 0.9 times and less than or equal to 1.1 times, still further preferably more than or equal to 0.95 times and less than or equal to 1.05 times A.

The sum of B and F, which are respectively the number of the memory cells 10a of the memory cell group 50B and the number of the memory cells 10b of the memory cell group 50F, is preferably the same as the sum of C and E, which are respectively the number of the memory cells 10a of the memory cell group 50C and the number of the memory cells 10b of the memory cell group 50E. Specifically, C+E is preferably more than or equal to 0.8 times and less than or equal to 1.2 times, further preferably more than or equal to 0.9 times and less than or equal to 1.1 times, still further preferably more than or equal to 0.95 times and less than or equal to 1.05 times B+F.

[Memory Cell]

Figure 6A:
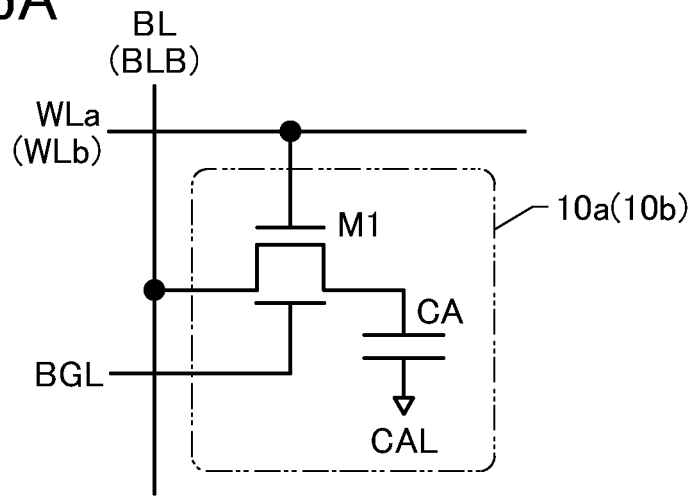
FIGS. 6A to 6C show circuit configuration examples of a memory cell.

FIG. 6A shows an example of a circuit configuration that can be used for the memory cell 10a and the memory cell 10b. The memory cell 10a and the memory cell 10b each include a transistor M1 and a capacitor CA. The transistor M1 includes a front gate (also simply referred to as a gate in some cases) and a back gate.

One of a source and a drain of the transistor M1 is electrically connected to one electrode of the capacitor CA, the other of the source and the drain of the transistor M1 is electrically connected to one of the bit line BL and the bit line BLB, the gate of the transistor M1 is electrically connected to one of the word line WLa and the word line WLb, and the back gate of the transistor M1 is electrically connected to a wiring BGL. The other electrode of the capacitor CA is electrically connected to a wiring CAL.

The wiring CAL functions as a wiring for applying a predetermined potential to the other electrode of the capacitor CA. At the time of data writing and reading, a low-level potential (also referred to as a reference potential in some cases) is preferably applied to the wiring CAL.

The wiring BGL functions as a wiring for applying a potential to the back gate of the transistor M1. By applying a given potential to the wiring BGL, the threshold voltage of the transistor M1 can be changed.

Data writing and reading are performed by supplying a potential that turns on the transistor M1 to the word line WLa and/or the word line WLb so that the transistor M1 is turned on and the bit line BL or the bit line BLB and the one electrode of the capacitor CA are electrically connected to each other.

Figure 6B:
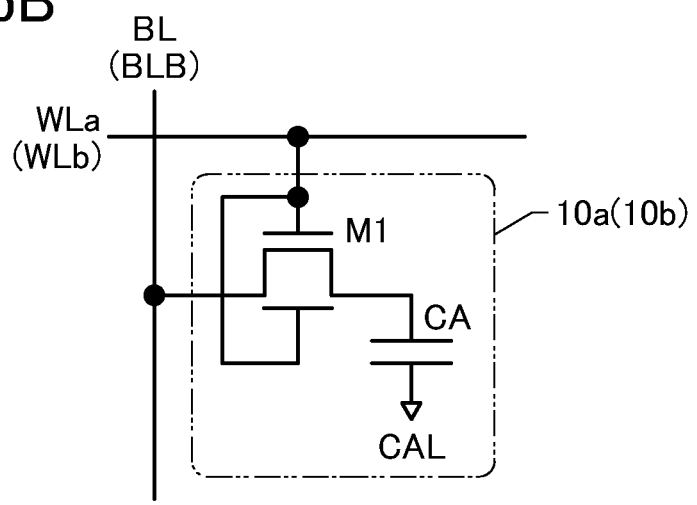

Alternatively, a circuit configuration shown as an example in FIG. 6B may be used for the memory cell 10a and the memory cell 10b. In the circuit configuration example shown in FIG. 6B, the back gate of the transistor M1 is electrically connected not to the wiring BGL, but the word line WLa or the word line WLb. Such a configuration enables the same voltage to be applied to the gate and the back gate of the transistor M1, and thus increases a current (on-state current) flowing through the source and the drain of the transistor M1 when the transistor M1 is on.

Figure 6C:
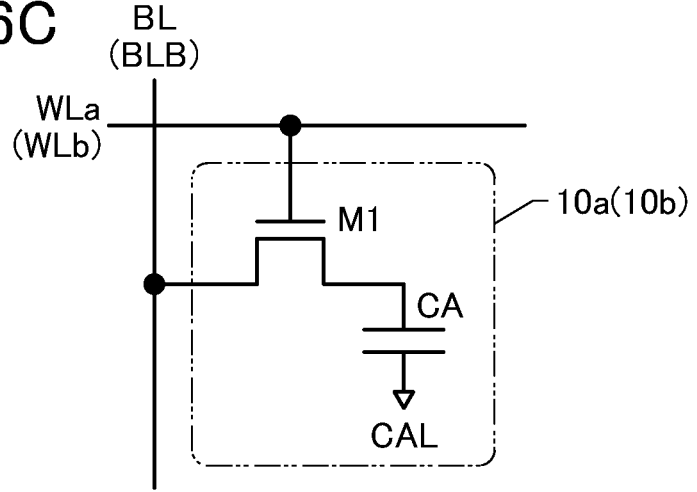

Alternatively, the transistor M1 may be a single-gate transistor, that is, a transistor that does not include a back gate. FIG. 6C shows a circuit configuration example in which the transistor M1 is a single-gate transistor. Since the transistor M1 shown in FIG. 6C does not include a back gate, the manufacturing process of the memory cell can be shortened.

A transistor in which an oxide semiconductor is used for a semiconductor layer where a channel is formed (also referred to as an "ox transistor") is preferably used as the transistor M1. For the semiconductor layer where a channel is formed, for example, an oxide semiconductor containing one of indium, an element M (aluminum, gallium, yttrium, or tin), and zinc can be used. In particular, an oxide semiconductor containing indium, gallium, and zinc is preferably used for the semiconductor layer of the ox transistor.

The ox transistor using the oxide semiconductor containing indium, gallium, and zinc has a characteristic of an extremely low off-state current. The use of the ox transistor as the transistor M1 enables the transistor M1 to have an extremely low leakage current. That is, written data can be retained by the transistor M1 for a long time, and thus the frequency of the refresh operation for the memory cell can be decreased. Moreover, the refresh operation for the memory cell can be omitted. Owing to an extremely low leakage current, the memory cell can retain multilevel data or analog data.

In this specification and the like, a DRAM using an ox transistor is referred to as a dynamic oxide semiconductor random access memory (DOSRAM). A DOSRAM can be formed by using the ox transistor as the transistor M1.

Figure 7A:
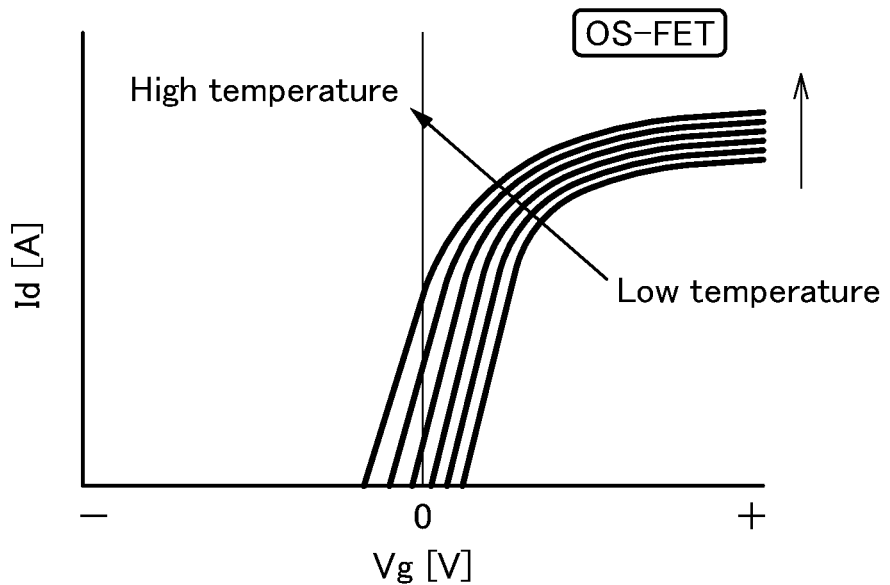
FIGS. 7A and 7B show the Id-Vg characteristics of a transistor and a change in VBias of the transistor.

FIG. 7A shows an example of Id-Vg characteristics, which are the electrical characteristics of a transistor. The Id-Vg characteristics show a change in drain current (Id) with respect to a change in gate voltage (Vg). In FIG. 7A, the horizontal axis represents Vg on a linear scale, and the vertical axis represents Id on a log scale. FIG. 7A shows the Id-Vg characteristics of an ox transistor.

As shown in FIG. 7A, the off-state current of the ox transistor is less likely to increase even in the operation at high temperatures. However, the Vth of the ox transistor shifts in the negative direction with the increase in temperature. For this reason, in the case of using an ox transistor as the transistor M1, bias voltage (VBias) for temperature correction is preferably added to Vg and/or the back gate voltage ($V_{BG}$).

Figure 7B:
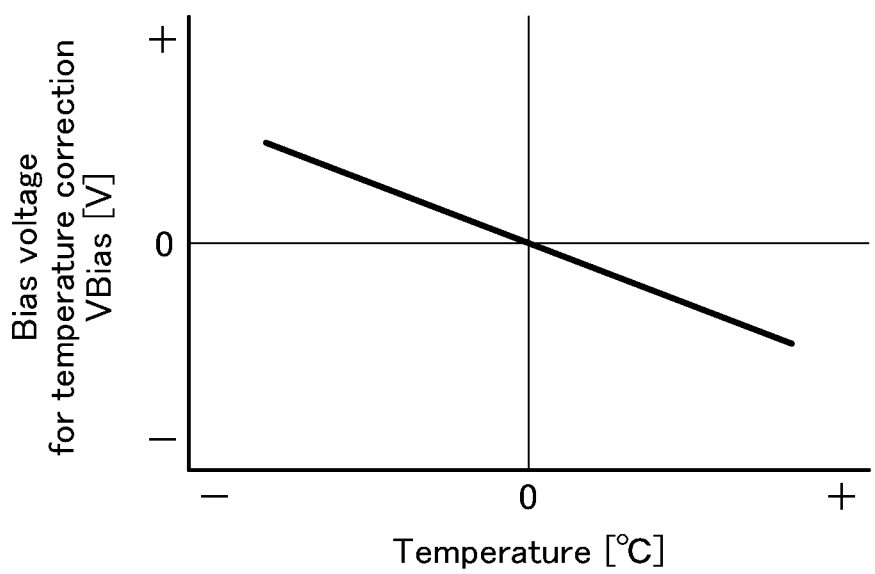

FIG. 7B shows an example of a change in VBias with respect to a temperature change. In FIG. 7B, the horizontal axis represents temperature on a linear scale, and the vertical axis represents VBias on a linear scale. As the operation temperature of the transistor M1 becomes high, the level of VBias becomes low. The level of VBias may change linearly or nonlinearly with respect to the temperature change. Although VBias is 0 V at 0° C. in FIG. 7B, VBias may be 0 V at 20° C., for example.

This embodiment can be implemented in an appropriate combination with any of the structures described in the other embodiments and the like.

Embodiment 2

In this embodiment, cross-sectional structure examples of the memory device 100 and a memory device 100A are described with reference to drawings.

<Structure Example of Memory Device>

Figure 10:
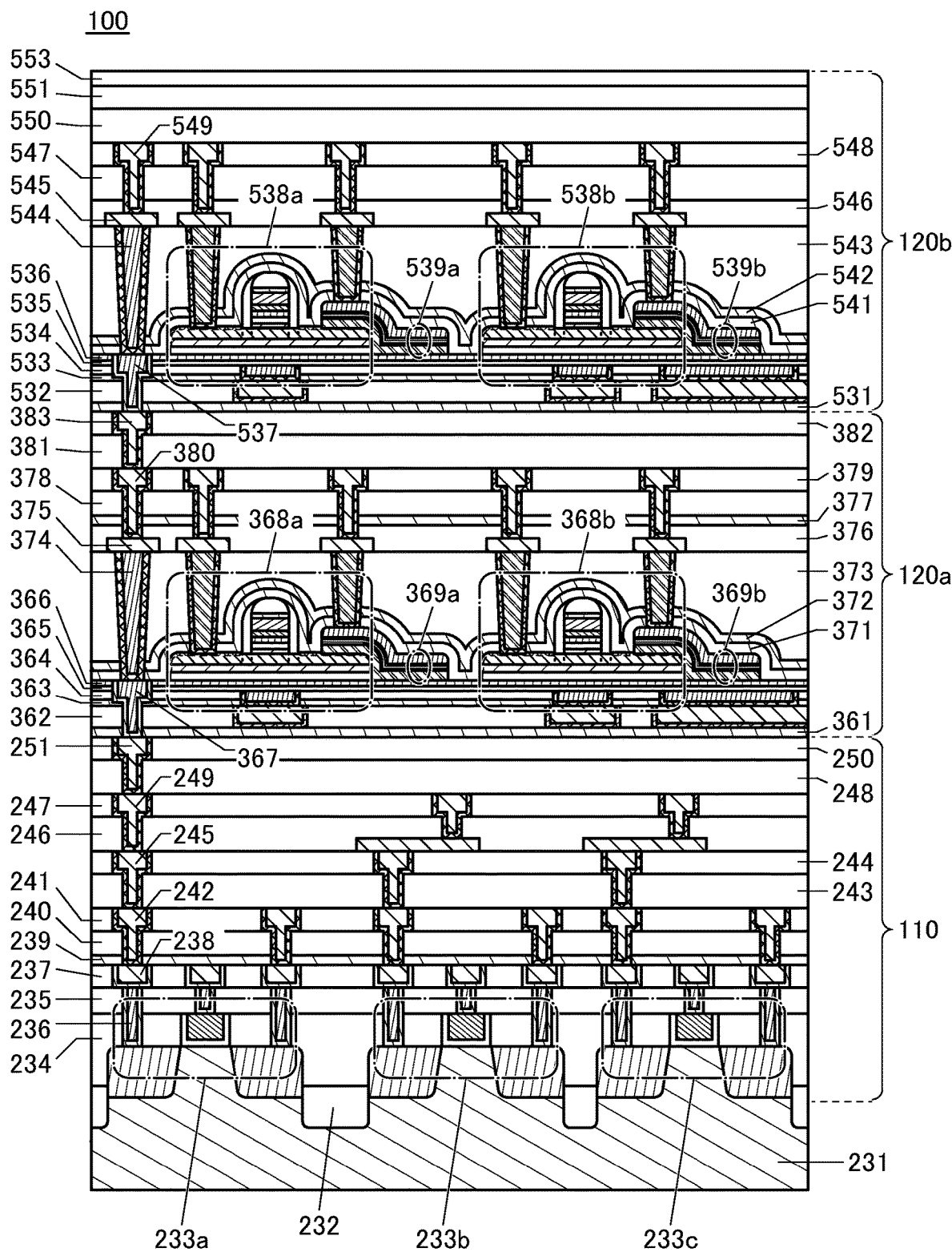
FIG. 10 illustrates a structure example of a semiconductor device.

FIG. 10 illustrates a cross section of part of the memory device 100. The layer 110, the layer 120*a*, and the layer 120*b* are stacked over a substrate 231 in the memory device 100 illustrated in FIG. 10. FIG. 10 illustrates a case where a single crystal semiconductor substrate (e.g., a single crystal silicon substrate) is used as the substrate 231. A source, a drain, and a channel of a transistor in the layer 110 are formed in part of the substrate 231. The layer 120*a* and the layer 120*b* each include a thin film transistor (e.g., an ox transistor).

[Layer 110]

The layer 110 in FIG. 10 includes, over the substrate 231, a transistor 233*a*, a transistor 233*b*, and a transistor 233*c*. FIG. 10 illustrates cross sections of the transistor 233*a*, the transistor 233*b*, and the transistor 233*c* in the channel length direction.

Channels of the transistor 233*a*, the transistor 233*b*, and the transistor 233*c* are formed in part of the substrate 231. When an integrated circuit is required to operate at high speed, a single crystal semiconductor substrate is preferably used as the substrate 231.

The transistor 233*a*, the transistor 233*b*, and the transistor 233*c* are electrically isolated from each other by an element isolation layer 232. The element isolation layer can be formed by a local oxidation of silicon (LOCOS) method, a shallow trench isolation (STI) method, or the like.

An insulating layer 234, an insulating layer 235, and an insulating layer 237 are provided over the transistor 233*a*, the transistor 233*b*, and the transistor 233*c*, and an electrode 238 is embedded in the insulating layer 237. The electrode 238 is electrically connected to one of a source and a drain of the transistor 233*a* through a contact plug 236.

An insulating layer 239, an insulating layer 240, and an insulating layer 241 are provided over the electrode 238 and the insulating layer 237, and an electrode 242 is embedded in the insulating layers 239, 240, and 241. The electrode 242 is electrically connected to the electrode 238.

An insulating layer 243 and an insulating layer 244 are provided over the electrode 242 and the insulating layer 241, and an electrode 245 is embedded in the insulating layers 243 and 244. The electrode 245 is electrically connected to the electrode 242.

An insulating layer 246 and an insulating layer 247 are provided over the electrode 245 and the insulating layer 244, and an electrode 249 is embedded in the insulating layers 246 and 247. The electrode 249 is electrically connected to the electrode 245.

An insulating layer 248 and an insulating layer 250 are provided over the electrode 249 and the insulating layer 247, and an electrode 251 is embedded in the insulating layers 248 and 250. The electrode 251 is electrically connected to the electrode 249.

[Layer 120*a*]

The layer 120*a* is provided over the layer 110. The layer 120*a* in FIG. 10 includes a transistor 368*a*, a transistor 368*b*, a capacitor 369*a*, and a capacitor 369*b*. FIG. 10 illustrates cross sections of the transistor 368*a* and the transistor 368*b* in the channel length direction. The transistor 368*a* and the transistor 368*b* are each a transistor including a back gate.

It is preferable that an oxide semiconductor, which is one kind of metal oxide, be used for the semiconductor layer of each of the transistor 368*a* and the transistor 368*b*. That is, an ox transistor is preferably used as each of the transistor 368*a* and the transistor 368*b*.

The transistor 368*a* and the transistor 368*b* are provided over an insulating layer 361 and an insulating layer 362. An insulating layer 363 and an insulating layer 364 are provided over the insulating layer 362. The back gates of the transistor 368*a* and the transistor 368*b* are embedded in the insulating layers 363 and 364. An insulating layer 365 and an insulating layer 366 are provided over the insulating layer 364. An electrode 367 is embedded in the insulating layers 361 to 366. The electrode 367 is electrically connected to the electrode 251.

An insulating layer 371, an insulating layer 372, and an insulating layer 373 are formed over the transistor 368*a*, the transistor 368*b*, the capacitor 369*a*, and the capacitor 369*b*, and an electrode 375 is formed over the insulating layer 373. The electrode 375 is electrically connected to the electrode 367 through a contact plug 374.

An insulating layer 376, an insulating layer 377, an insulating layer 378, and an insulating layer 379 are provided over the electrode 375. An electrode 380 is embedded in the insulating layers 376 to 379. The electrode 380 is electrically connected to the electrode 375.

An insulating layer 381 and an insulating layer 382 are provided over the electrode 380 and the insulating layer 379, and an electrode 383 is embedded in the insulating layers 381 and 382. The electrode 383 is electrically connected to the electrode 380.

[Layer 120*b*]

The layer 120*b* is provided over the layer 120*a*. The layer 120*b* in FIG. 10 includes a transistor 538*a*, a transistor 538*b*, a capacitor 539*a*, and a capacitor 539*b*. FIG. 10 illustrates cross sections of the transistor 538*a* and the transistor 538*b* in the channel length direction. The transistor 538*a* and the transistor 538*b* are each a transistor including a back gate.

It is preferable that an oxide semiconductor, which is one kind of metal oxide, be used for the semiconductor layer of each of the transistor 538*a* and the transistor 538*b*. That is, an ox transistor is preferably used as each of the transistor 538*a* and the transistor 538*b*.

The transistor 538*a* and the transistor 538*b* are provided over an insulating layer 531 and an insulating layer 532. An insulating layer 533 and an insulating layer 534 are provided over the insulating layer 532. The back gates of the transistor 538*a* and the transistor 538*b* are embedded in the insulating layers 533 and 534. An insulating layer 535 and an insulating layer 536 are provided over the insulating layer 534. An electrode 537 is embedded in the insulating layers 531 to 536. The electrode 537 is electrically connected to the electrode 383.

An insulating layer 541, an insulating layer 542, and an insulating layer 543 are formed over the transistor 538*a*, the transistor 538*b*, the capacitor 539*a*, and the capacitor 539*b*, and an electrode 545 is formed over the insulating layer 543. The electrode 545 is electrically connected to the electrode 537 through a contact plug 544.

An insulating layer 546, an insulating layer 547, and an insulating layer 548 are provided over the electrode 545. An electrode 549 is embedded in the insulating layers 546 to 548. The electrode 549 is electrically connected to the electrode 545.

An insulating layer 550 and an insulating layer 551 are provided over the electrode 549 and the insulating layer 548. An insulating layer 553 is provided over the insulating layer 551.

Modification Example

Figure 11:
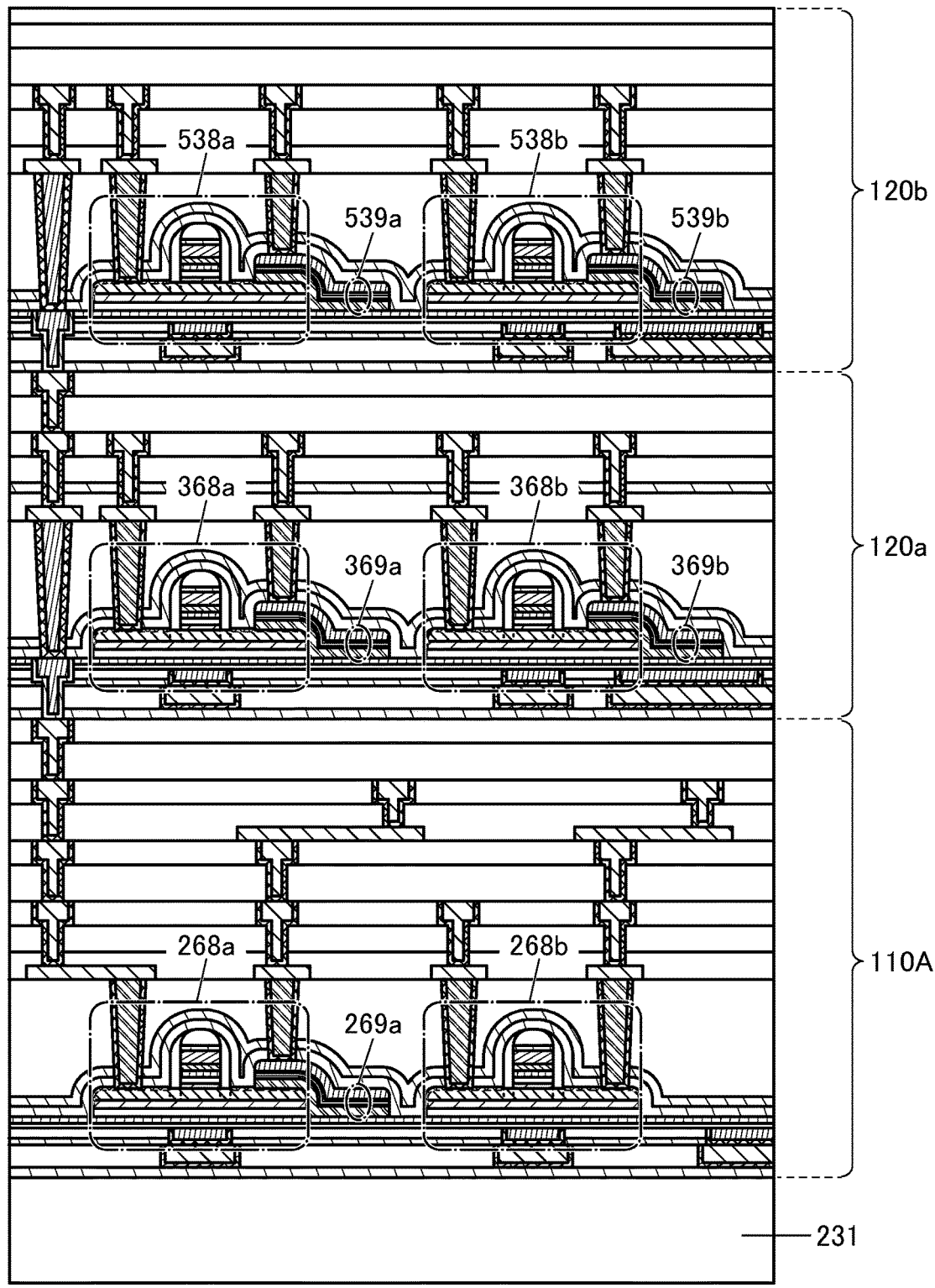
FIG. 11 illustrates a structure example of a semiconductor device.

FIG. 11 illustrates a cross section of part of a memory device 100A. The memory device 100A is a modification example of the memory device 100. The memory device 100A includes a layer 110A, the layer 120a, and the layer 120b. The layer 110A, the layer 120a, and the layer 120b are provided over the substrate 231 in this order. An insulating substrate (e.g., a glass substrate) is used as the substrate 231 of the memory device 100A.

The layer 110A includes a transistor 268a, a transistor 268b, and a capacitor 269a. A thin film transistor (e.g., an ox transistor) is used as each of the transistors in the layer 110A. The layer 120a and the layer 120b can be formed in a manner similar to those described above.

All the transistors in the layer 110A are ox transistors, whereby the layer 110A can be an integrated circuit in which all the transistors have the same conductivity. All the transistors in the memory device 100A are ox transistors, whereby the memory device 100A can be a memory device in which all the transistors have the same conductivity.

<Materials>
[Substrate]

There is no particular limitation on a material used for the substrate as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. That is, the substrate is not limited to a simple supporting substrate, and may be a substrate where a device such as another transistor is formed.

Still alternatively, as the substrate, a glass substrate of barium borosilicate glass, aluminoborosilicate glass, or the like, a ceramic substrate, a quartz substrate, a sapphire substrate, or the like can be used. Note that a flexible substrate may be used as the substrate. In the case where a flexible substrate is used, a transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer is preferably provided between the manufacturing substrate and the transistor, the capacitor, or the like.

For the flexible substrate, for example, metal, an alloy, resin, glass, or fiber thereof can be used. The flexible substrate used as the substrate preferably has a lower coefficient of linear expansion because deformation due to an environment is suppressed. The flexible substrate used as the substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon and aramid), polyimide, polycarbonate, and acrylic. In particular, aramid is preferably used for the flexible substrate because of its low coefficient of linear expansion.

[Insulating Layer]

The insulating layer is formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification and the like, a nitride oxide refers to a compound that contains more nitrogen than oxygen. An oxynitride refers to a compound that contains more oxygen than nitrogen. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer that is measured by secondary ion mass spectrometry (SIMS) is set lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is particularly preferable to lower the hydrogen concentration in the insulating layer in contact with the semiconductor layer.

Furthermore, the nitrogen concentration in the insulating layer is preferably lowered in order to prevent an increase in the nitrogen concentration in the semiconductor layer. Specifically, the nitrogen concentration in the insulating layer that is measured by SIMS is set lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable that a region of the insulating layer that is in contact with at least the semiconductor layer have few defects and typically have as few signals observed by electron spin resonance (ESR) spectroscopy as possible. Examples of the signals include a signal due to an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ is used.

In addition to the above-described signal, a signal due to nitrogen dioxide (NO$_2$) might be observed. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating layer whose spin density of a signal due to nitrogen dioxide ($NO_2$) is higher than or equal to $1\times10^{17}$ spins/cm$^3$ and lower than $1\times10^{18}$ spins/cm$^3$, for example.

Note that nitrogen oxide (NO)) such as nitrogen dioxide ($NO_2$) forms a state in the insulating layer. The state is positioned in the energy gap of the oxide semiconductor layer. Thus, when nitrogen oxide (NO)) is diffused to the interface between the insulating layer and the oxide semiconductor layer, an electron can be trapped by the state on the insulating layer side. As a result, the trapped electrons remain in the vicinity of the interface between the insulating layer and the oxide semiconductor layer; thus, the threshold voltage of the transistor shifts in the positive direction. Therefore, a shift in the threshold voltage of the transistor can be reduced when a film with a low nitrogen oxide content is used as the insulating layer.

As an insulating layer that releases little nitrogen oxide (NO)), for example, a silicon oxynitride layer can be used. The silicon oxynitride layer is a film of which the amount of released ammonia is larger than the amount of released nitrogen oxide (NO)) in thermal desorption spectroscopy (TDS); the typical amount of released ammonia is greater than or equal to $1\times10^{18}$/cm$^3$ and less than or equal to $5\times10^{19}$/cm$^3$. Note that the amount of released ammonia is the total amount of ammonia released by heat treatment in a range from 50° C. to 650° C. or a range from 50° C. to 550° C. in TDS.

Since nitrogen oxide (NOr) reacts with ammonia and oxygen in heat treatment, the use of an insulating layer that releases a large amount of ammonia reduces nitrogen oxide (NOr).

At least one of the insulating layers in contact with the oxide semiconductor layer is preferably formed using an insulating layer from which oxygen is released by heating. Specifically, it is preferable to use an insulating layer of which the amount of released oxygen converted into oxygen atoms is $1.0\times10^{18}$ atoms/cm$^3$ or more, $1.0\times10^{19}$ atoms/cm$^3$ or more, or $1.0\times10^{20}$ atoms/cm$^3$ or more in TDS performed under such a condition that a surface of the insulating layer is heated at a temperature higher than or equal to 100° C. and lower than or equal to 700° C., preferably higher than or equal to 100° C. and lower than or equal to 500° C. Note that in this specification and the like, oxygen released by heating is also referred to as "excess oxygen".

The insulating layer containing excess oxygen can be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used for the treatment for adding oxygen include an oxygen gas such as $^{16}O_2$ or $^{18}O_2$ and a gas containing oxygen such as a nitrous oxide gas or an ozone gas. In this specification, the treatment for adding oxygen is also referred to as "oxygen doping treatment". The oxygen doping treatment may be performed while the substrate is heated.

A heat-resistant organic material such as polyimide, an acrylic-based resin, a benzocyclobutene-based resin, polyamide, or an epoxy-based resin can be used for the insulating layer. Other than the above organic materials, a low-dielectric constant material (low-k material), a siloxane-based resin, phosphosilicate glass (PSG), borophosphosilicate glass (BPSG), or the like can be used. Note that the insulating layer may be formed by stacking a plurality of insulating layers formed using any of these materials.

Note that the siloxane-based resin corresponds to a resin including a Si—O—Si bond formed using a siloxane-based material as a starting material. The siloxane-based resin may contain, as a substituent, an organic group (e.g., an alkyl group or an aryl group) or a fluoro group. The organic group may contain a fluoro group.

There is no particular limitation on the method for forming the insulating layer. Note that a baking step is necessary in some cases depending on a material used for the insulating layer. When the baking step of the insulating layer also serves as a heat treatment step for another layer, the transistor can be manufactured efficiently.

[Electrode]

As a conductive material for forming the electrode, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or a silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, indium tin oxide to which silicon is added, or indium gallium zinc oxide containing nitrogen may be used.

A stack of a plurality of conductive layers formed with the above materials may be used. For example, a layered structure formed using a material containing the above metal element and a conductive material containing oxygen may be used. Alternatively, a layered structure formed using a material containing the above metal element and a conductive material containing nitrogen may be used. Still alternatively, a layered structure formed using a material containing the above metal element, a conductive material containing oxygen, and a conductive material containing nitrogen may be used. Still further alternatively, a layered structure formed using a conductive material containing nitrogen and a conductive material containing oxygen may be used.

Note that in the case where an oxide semiconductor is used for the semiconductor layer and a layered structure formed using a material containing the above metal element and a conductive material containing oxygen is used as the gate electrode, the conductive material containing oxygen is preferably provided on the semiconductor layer side. By providing the conductive material containing oxygen on the semiconductor layer side, oxygen released from the conductive material is likely to be supplied to the semiconductor layer.

The electrode may be formed using, for example, a conductive material with high embeddability, such as tungsten or polysilicon. A conductive material with high embeddability and a barrier layer (diffusion prevention layer) such as a titanium layer, a titanium nitride layer, or a tantalum nitride layer may be used in combination. Note that the electrode may be referred to as a "contact plug".

In particular, the electrode in contact with a gate insulating layer is preferably formed using a conductive material that is relatively impermeable to impurities. As an example of the conductive material that is relatively impermeable to impurities, tantalum nitride is given.

When the insulating layer is formed using an insulating material that is relatively impermeable to impurities and the electrode in contact with the gate insulating layer is formed using a conductive material that is relatively impermeable to impurities, diffusion of impurities into the transistor can be further suppressed. Thus, the reliability of the transistor can be further increased, that is, the reliability of the memory device can be further increased.

[Semiconductor Layer]

For the semiconductor layer, a single-crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

The semiconductor layer may have a layered structure. In this case, the layered structure may be formed using semiconductor materials having different crystal states or using different semiconductor materials.

The band gap of an oxide semiconductor is greater than or equal to 2 eV; thus, when the oxide semiconductor is used for the semiconductor layer, a transistor with an extremely low off-state current can be provided. Specifically, the off-state current per micrometer in channel width at room temperature (typically 25° C.) and at a source-drain voltage of 3.5 V can be lower than $1\times10^{-20}$ A, lower than $1\times10^{-22}$ A, or lower than $1\times10^{-24}$ A. That is, the on/off ratio of the transistor can be greater than or equal to 20 digits. A transistor using an oxide semiconductor for the semiconductor layer has high withstand voltage between its source and drain. Thus, a transistor with high reliability can be provided. Furthermore, a transistor with high output voltage and high withstand voltage can be provided. Furthermore, a memory device or the like with high reliability can be provided. Furthermore, a memory device or the like with high output voltage and high withstand voltage can be provided.

In this specification and the like, a transistor in which silicon having crystallinity is used for a semiconductor layer where a channel is formed is also referred to as a "crystalline Si transistor".

The crystalline Si transistor tends to obtain relatively high mobility as compared with the ox transistor. On the other hand, the crystalline Si transistor has difficulty in obtaining an extremely low off-state current unlike the ox transistor. Thus, it is important that the semiconductor material used for the semiconductor layer be selected depending on the purpose and the usage. For example, depending on the purpose and the usage, the ox transistor and the crystalline Si transistor may be used in combination.

In the case where the semiconductor layer is formed using an oxide semiconductor layer, the oxide semiconductor layer is preferably formed by a sputtering method. The oxide semiconductor layer is preferably formed by a sputtering method, in which case the oxide semiconductor layer can have high density. In the case where the oxide semiconductor layer is formed by a sputtering method, a rare gas (typically argon), oxygen, or a mixed gas of a rare gas and oxygen is used as a sputtering gas. In addition, increasing the purity of the sputtering gas is necessary. For example, an oxygen gas or a rare gas used as a sputtering gas is a gas that is highly purified to have a dew point of −60° C. or lower, preferably −100° C. or lower. By using the sputtering gas that is highly purified, entry of moisture or the like into the oxide semiconductor layer can be prevented as much as possible.

In the case where an oxide semiconductor layer is formed by a sputtering method, it is preferable that moisture in a deposition chamber in a sputtering apparatus be removed as much as possible. For example, with an adsorption vacuum evacuation pump such as a cryopump, the deposition chamber is preferably evacuated to be a high vacuum state (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

[Metal Oxide]

An oxide semiconductor preferably contains at least indium or zinc. In particular, indium and zinc are preferably contained. In addition to these, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also referred to as a metal oxide in some cases. Moreover, a metal oxide containing nitrogen may be referred to as a metal oxynitride.

[Composition of Metal Oxide]

Described below is the composition of a cloud-aligned composite oxide semiconductor (CAC-OS) that can be used in a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) functioning as carriers to flow, and the insulating function is to not allow electrons functioning as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, a high on-state current and high field-effect mobility, can be obtained.

In other words, the CAC-OS or the CAC metal oxide can be referred to as a matrix composite or a metal matrix composite.

[Structure of Metal Oxide]

An oxide semiconductor (metal oxide) is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of lattice arrangement changes between a region with uniform lattice arrangement and another region with uniform lattice arrangement in a region where the nanocrystals are connected.

The shape of the nanocrystal is basically hexagon but is not always a regular hexagon and is a non-regular hexagon in some cases. A pentagonal lattice arrangement, a heptagonal lattice arrangement, and the like are sometimes included in the distortion. Note that it is difficult to observe a clear crystal grain boundary even in the vicinity of distortion in the CAAC-OS. That is, a lattice arrangement is distorted, and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter an In layer) and a layer containing the element M, zinc, and oxygen (hereinafter an (M, Zn) layer) are stacked. Note that indium and the element M can be replaced with each other, and when the element M of the (M, Zn) layer is replaced with indium, the layer can also be referred to as an (In, M, Zn) layer. When indium of the In layer is replaced with the element M, the layer can also be referred to as an (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures which show different properties. Two or more of the amorphous oxide semiconductor, the polycrystalline oxide semiconductor, the a-like OS, the nc-OS, and the CAAC-OS may be included in the oxide semiconductor of one embodiment of the present invention.

[Transistor Including Metal Oxide]

Next, the case where the metal oxide is used for a channel formation region of a transistor is described.

When the metal oxide is used for a channel formation region of a transistor, the transistor can have high field-effect mobility. In addition, the transistor can have high reliability.

Moreover, a metal oxide with low carrier density is preferably used for the transistor. In order to reduce the carrier density of the metal oxide film, the concentration of impurities in the metal oxide film is reduced so that the density of defect states can be reduced. In this specification and the like, a state with a low impurity concentration and a low density of defect states is referred to as a highly purified intrinsic or substantially highly purified intrinsic state. The metal oxide has, for example, a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

A highly purified intrinsic or substantially highly purified intrinsic metal oxide film has a low density of defect states and accordingly has a low density of trap states in some cases.

Charges trapped by the trap states in the metal oxide take a long time to be released and may behave like fixed charges. Thus, a transistor including the metal oxide having a high density of trap states in the channel formation region has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. As examples of the impurities, hydrogen, nitrogen, alkali metal, alkaline earth metal, iron, nickel, silicon, and the like are given.

[Impurity]

Here, the influence of impurities in the metal oxide is described.

When silicon or carbon that is one of Group 14 elements is contained in the metal oxide, defect states are formed in the metal oxide. Thus, the concentration of silicon or carbon (measured by SIMS) is set to lower than or equal to $2 \times 10^{18}$ atoms/cm$^3$, preferably lower than or equal to $2 \times 10^{17}$ atoms/cm$^3$ in the metal oxide or in the vicinity of an interface with the metal oxide.

When the metal oxide contains an alkali metal or an alkaline earth metal, defect states are formed and carriers are generated, in some cases. Thus, a transistor including a metal oxide that contains an alkali metal or an alkaline earth metal in a channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide, which is measured by SIMS, is lower than or equal to $1 \times 10^{18}$ atoms/cm$^3$, preferably lower than or equal to $2 \times 10^{16}$ atoms/cm$^3$.

When the metal oxide contains nitrogen, the metal oxide easily becomes n-type by generation of electrons functioning as carriers and an increase of carrier density. Thus, a transistor whose channel formation region includes a metal oxide containing nitrogen is likely to have normally-on characteristics. For that reason, nitrogen in the channel formation region of the metal oxide is preferably reduced as much as possible; for example, the concentration of nitrogen in the metal oxide measured by SIMS is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in a metal oxide reacts with oxygen bonded to a metal atom to be water, and thus causes an oxygen vacancy, in some cases. Entry of hydrogen into the oxygen vacancy generates an electron functioning as a carrier in some cases. Furthermore, in some cases, bonding of part of hydrogen to oxygen bonded to a metal atom causes generation of an electron functioning as a carrier. Thus, a transistor including a metal oxide that contains hydrogen for a channel formation region is likely to have normally-on characteristics. For this reason, hydrogen in the metal oxide is preferably reduced as much as possible. Specifically, the hydrogen concentration of the metal oxide measured by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When a metal oxide with sufficiently reduced impurity concentration is used for a channel formation region in a transistor, the transistor can have stable electrical characteristics.

<Deposition Method>

An insulating material for forming the insulating layers, a conductive material for forming the electrodes, or a semiconductor material for forming the semiconductor layers can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, a pulsed laser deposition (PLD) method, a dipping method, a spray coating method, a droplet discharge method (such as an inkjet method), or a printing method (such as screen printing or offset printing).

By using a PECVD method, a high-quality film can be formed at a relatively low temperature. By using a deposition method that does not use plasma for deposition, such as an MOCVD method, an ALD method, or a thermal CVD method, damage is not easily caused on a surface on which the film is deposited. For example, a wiring, an electrode, an element (e.g., a transistor or a capacitor), or the like included in a memory device might be charged up by receiving charges from plasma. In that case, accumulated charges might break the wiring, electrode, element, or the like included in the memory device. Such plasma damage is not caused in the case of using a deposition method without using plasma, and thus the yield of a memory device can be increased. In addition, since plasma damage is not caused in the deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a desired composition can be formed depending on a flow rate ratio of the source gases. Moreover, with a CVD method or an ALD method, by changing the flow rate ratio of the source gases during the deposition, a film whose composition is continuously changed can be formed. In the case where the film is formed while changing the flow rate ratio of the source gases, as compared with the case where the film is formed using a plurality of deposition chambers, time taken for the film formation can be reduced because time taken for transfer and pressure adjustment is omitted. Thus, memory devices can be manufactured with improved productivity.

In the case where a film is formed by an ALD method, a gas that does not contain chlorine is preferably used as a material gas.

This embodiment can be implemented in an appropriate combination with any of the structures described in the other embodiments and the like.

Embodiment 3

In this embodiment, examples of an electronic component and an electronic device that include the memory device of the above embodiments are described.

<Electronic Component>

First, examples of an electronic component including the memory device 100 are described with reference to FIGS. 12A and 12B.

Figure 12A:
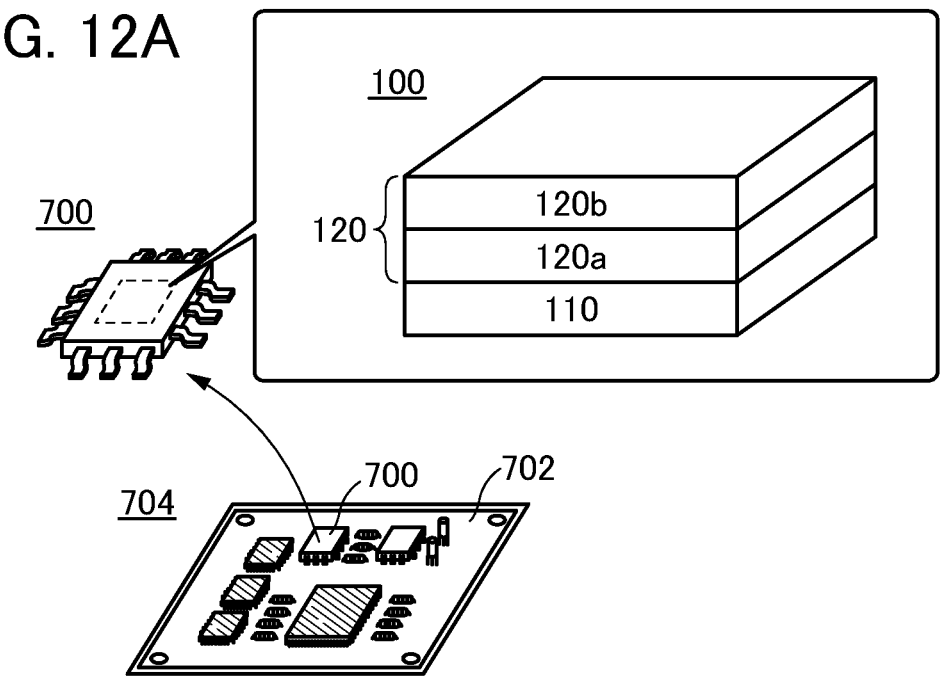
FIGS. 12A and 12B illustrate examples of an electronic component.

FIG. 12A is a perspective view of an electronic component 700 and a substrate (circuit board 704) on which the electronic component 700 is mounted. The electronic component 700 illustrated in FIG. 12A is an IC chip including a lead and a circuit portion. The electronic component 700 is mounted on a printed circuit board 702, for example. A plurality of such IC chips are combined and electrically connected to each other on the printed circuit board 702; thus, the circuit board 704 is formed.

The memory device 100 described in the above embodiments is provided as a circuit portion of the electronic component 700. Although a quad flat package (QFP) is used as the package of the electronic component 700 in FIG. 12A, the mode of the package is not limited thereto.

Figure 12B:
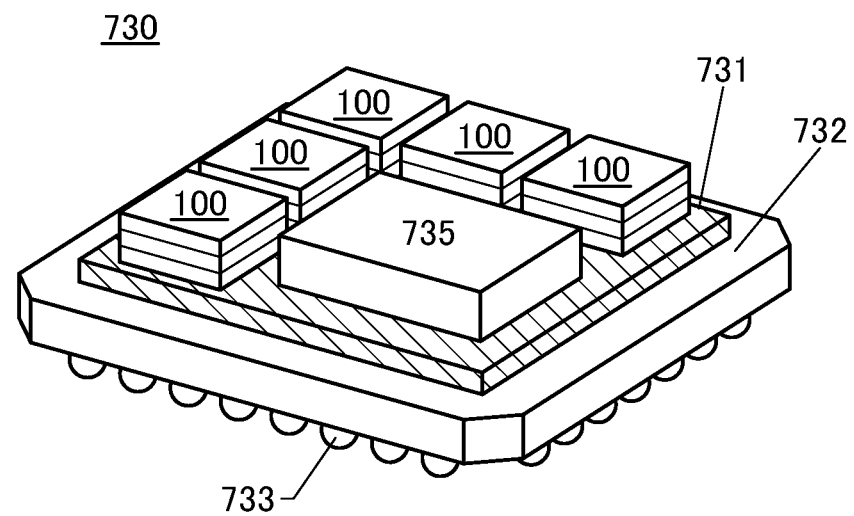

FIG. 12B is a perspective view of an electronic component 730. The electronic component 730 is an example of a system in package (SiP) or a multi-chip module (MCM). In the electronic component 730, an interposer 731 is provided over a package substrate 732 (printed circuit board) and a semiconductor device 735 and a plurality of memory devices 100 are provided over the interposer 731.

The electronic component 730 using the memory device 100 as a high bandwidth memory (HBM) is illustrated as an example. As the semiconductor device 735, an integrated circuit (semiconductor device) such as a central processing unit (CPU), a graphics processing unit (GPU), or a field programmable gate array (FPGA) can be used.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting the plurality of integrated circuits with different terminal pitches. The plurality of wirings are provided to have a single-layer structure or a layered structure. The interposer 731 has a function of electrically connecting an integrated circuit provided on the interposer 731 to an electrode provided on the package substrate 732. Accordingly, the interposer is referred to as a rewiring substrate or an intermediate substrate in some cases. A through electrode may be provided in the interposer 731 and used for electrically connecting the integrated circuit and the package substrate 732. In the case of using a silicon interposer, a through-silicon via (TSV) can also be used as the through electrode.

A silicon interposer is preferably used as the interposer 731. The silicon interposer can be manufactured at lower cost than an integrated circuit because the silicon interposer is not necessarily provided with an active element. Moreover, since the wirings of the silicon interposer can be formed through a semiconductor process, formation of minute wirings that is difficult in a resin interposer is easily achieved.

In order to achieve a wide memory bandwidth, many wirings need to be connected to an HBM. Therefore, minute wirings are required to be formed densely on an interposer on which an HBM is mounted. For this reason, it is preferable that a silicon interposer be used as the interposer on which an HBM is mounted.

In an SiP, an MCM, or the like using a silicon interposer, decrease in reliability due to a difference in expansion coefficient between an integrated circuit and the interposer does not easily occur. Furthermore, the surface of a silicon interposer has high planarity, so that a poor connection between the silicon interposer and an integrated circuit provided thereon does not easily occur. It is particularly preferable to use a silicon interposer for a 2.5D package (2.5D mounting) in which a plurality of integrated circuits are arranged side by side on an interposer.

A heat sink (radiator plate) may be provided to overlap with the electronic component 730. In this case, the heights of integrated circuits provided on the interposer 731 are preferably equal to each other. In the electronic component 730 of this embodiment, the heights of the memory device 100 and the semiconductor device 735 are preferably equal to each other, for example.

An electrode 733 for mounting the electronic component 730 on another substrate may be provided on the bottom portion of the package substrate 732. FIG. 12B illustrates an example in which the electrode 733 is formed of a solder ball. Solder balls are provided in a matrix on the bottom portion of the package substrate 732, whereby a ball grid array (BGA) can be achieved. Alternatively, the electrode 733 may be formed of a conductive pin. Conductive pins are provided in a matrix on the bottom portion of the package substrate 732, whereby a pin grid array (PGA) can be achieved.

The electronic component 730 can be mounted on another substrate in various manners, not limited to the BGA and the PGA. For example, a staggered pin grid array (SPGA), a land grid array (LGA), a quad flat package (QFP), a quad flat J-leaded package (QFJ), or a quad flat non-leaded package (QFN) can be employed.

<Electronic Device>

Next, examples of an electronic device including the above electronic components are described with reference to FIGS. 13A to 13E and FIG. 14.

Figure 13A:
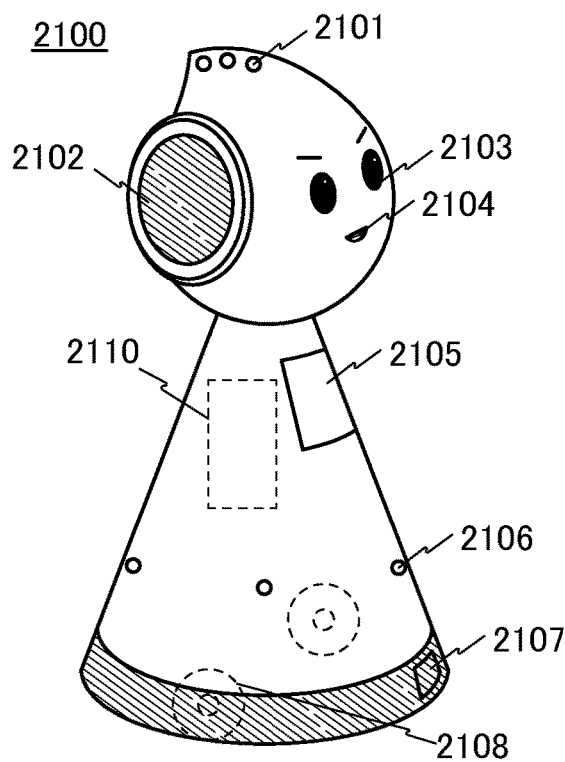
FIGS. 13A to 13E illustrate examples of an electronic device.

A robot 2100 illustrated in FIG. 13A includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The above electronic components can be used for the arithmetic device 2110, the illuminance sensor 2101, the upper camera 2103, the display 2105, the lower camera 2106, the obstacle sensor 2107, and the like of the robot 2100.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The above electronic components can be used for a memory device inside the robot 2100.

Figure 13B:
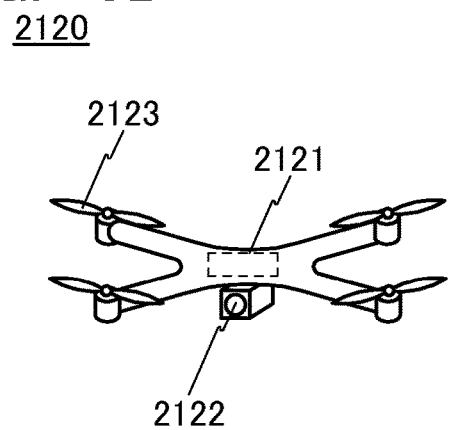

A flying object 2120 illustrated in FIG. 13B includes an arithmetic device 2121, a propeller 2123, and a camera 2122 and has a function of flying autonomously. The above electronic components can be used for a memory device inside the flying object 2120.

Figure 13C:
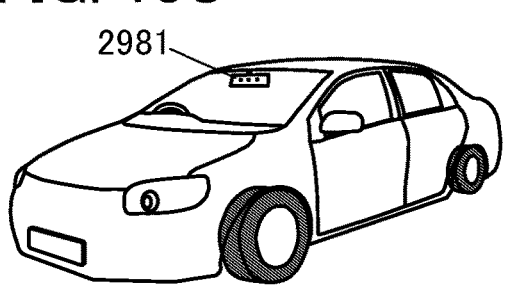

FIG. 13C is an external view illustrating an example of an automobile. An automobile 2980 includes a camera 2981 and the like. The automobile 2980 also includes various sensors and the like such as an infrared radar, a millimeter wave radar, and a laser radar. The automobile 2980 judges traffic information therearound such as the presence of a pedestrian with analyzing an image taken by the camera 2981, and thus can perform automatic driving. The above electronic components can be used for a memory device inside the automobile 2980.

Figure 13D:
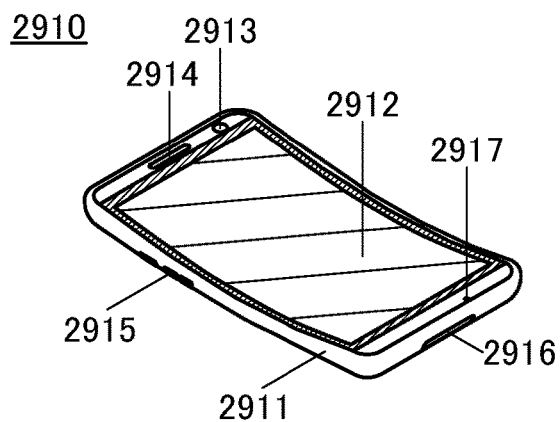

An information terminal 2910 illustrated in FIG. 13D includes a housing 2911, a display portion 2912, a microphone 2917, a speaker portion 2914, a camera 2913, an external connection portion 2916, an operation switch 2915, and the like. A touch screen and a display panel formed using flexible substrates are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader. The above electronic components can be used for a memory device inside the information terminal 2910.

Figure 13E:
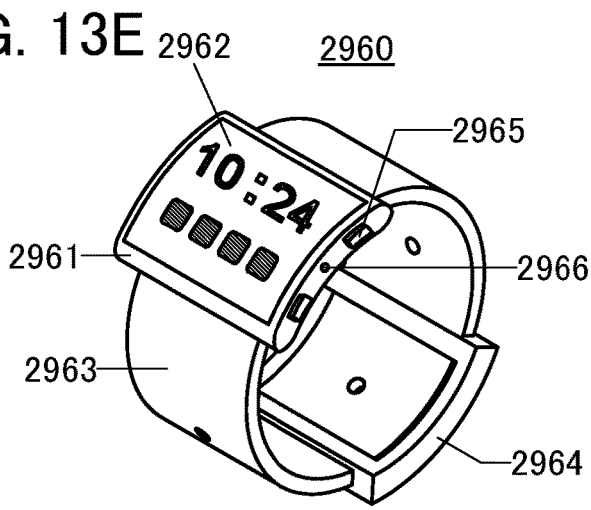

FIG. 13E illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, text viewing and editing, music reproduction, Internet communication, and computer games. The above electronic components can be used for a memory device inside the information terminal 2960.

Figure 14:
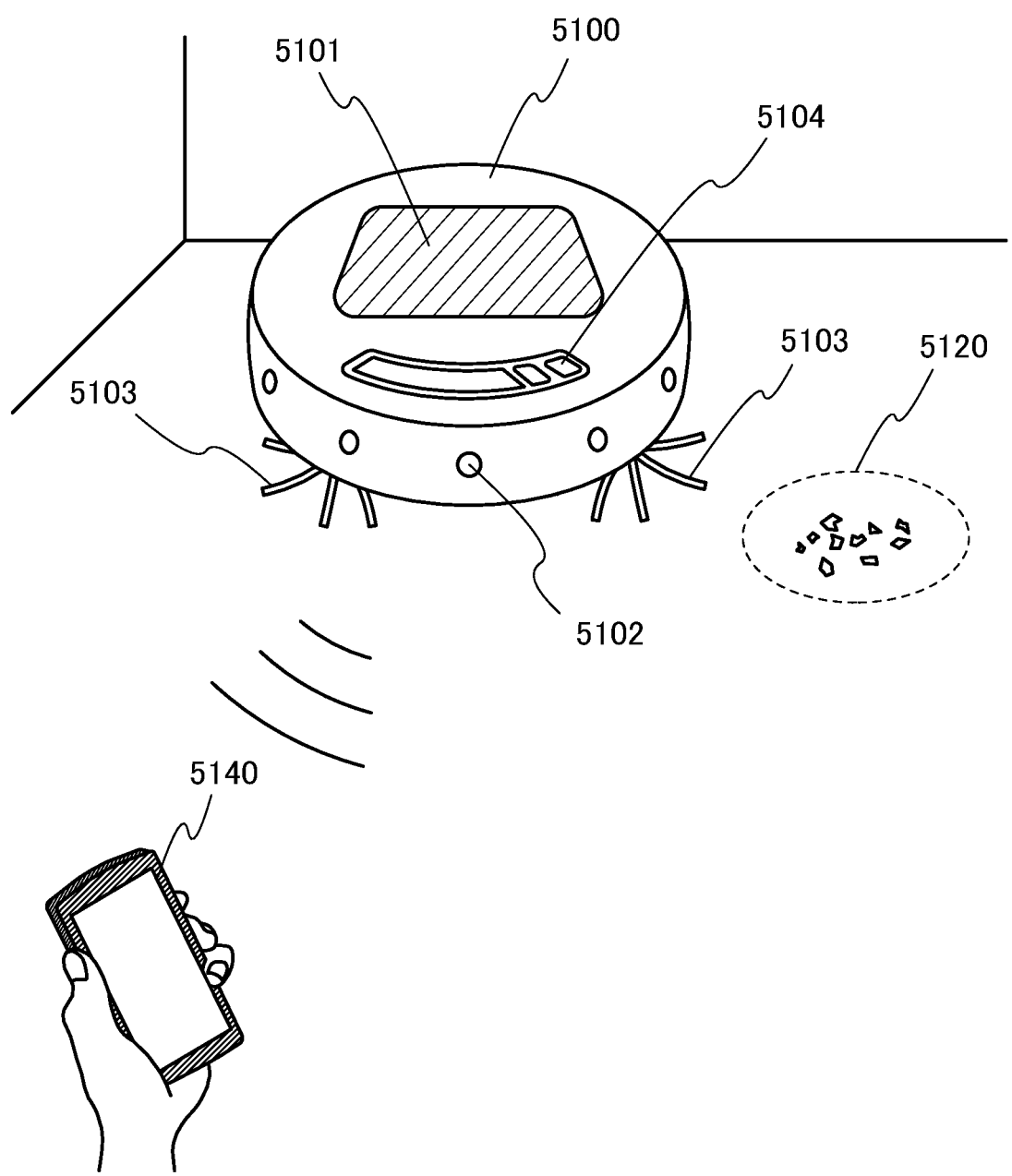
FIG. 14 illustrates an example of an electronic device.

FIG. 14 is a schematic view illustrating an example of a cleaning robot.

A cleaning robot 5100 includes a display 5101 on its top surface, a plurality of cameras 5102 on its side surface, a brush 5103, and an operation button 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a radio communication means. The above electronic components can be used for a memory device inside the cleaning robot 5100.

The cleaning robot 5100 can be self-propelled, detects dust 5120, and vacuums the dust through the inlet provided on the bottom surface.

The cleaning robot 5100 can judge whether there is an obstacle such as a wall, furniture, or a step by analyzing an image taken by the cameras 5102. In the case where the cleaning robot 5100 detects an object that is likely to be caught in the brush 5103, such as a cable, by analyzing an image, the rotation of the brush 5103 can be stopped.

The display 5101 can display the amount of power remaining in a battery, the amount of vacuumed dust, and the like. The display 5101 may display a path in which the cleaning robot 5100 has run. The display 5101 may be a touch panel and the operation button 5104 may be displayed on the display 5101.

The cleaning robot 5100 can communicate with a portable electronic device 5140 such as a smartphone. The portable electronic device 5140 can display an image taken by the cameras 5102. Therefore, an owner of the cleaning robot 5100 can monitor his/her room even when the owner is not at home.

This embodiment can be implemented in an appropriate combination with any of the structures described in the other embodiments and the like.

REFERENCE NUMERALS

10: memory cell, 10a: memory cell, 10b: memory cell, 100: memory device, 110: layer, 111: peripheral circuit, 112: control circuit, 115: peripheral circuit, 120: layer, 121: row decoder, 122: column decoder, 123: row driver, 124: column driver, 125: input circuit, 126: output circuit, 127: sense amplifier, 128: voltage generation circuit, 130a: cell array, 130b: cell array, 131: intersection point, 141: PSW, 142: PSW.

This application is based on Japanese Patent Application Serial No. 2017-229785 filed with Japan Patent Office on Nov. 30, 2017, the entire contents of which are hereby incorporated by reference.

The invention claimed is:

1. A memory device comprising:
a first cell array comprising A first memory cells, B first memory cells, and C first memory cells;
a second cell array comprising D second memory cells, E second memory cells, and F second memory cells; and
a first bit line pair and a second bit line pair,
wherein A, B, C, D, E, and F are integers greater than or equal to 1,
wherein each of the A first memory cells, the B first memory cells, and the C first memory cells comprises a first transistor and a first capacitor,
wherein each of the D second memory cells, the E second memory cells, and the F second memory cells comprises a second transistor and a second capacitor,
wherein one bit line of the first bit line pair is electrically connected to the first transistors of the A first memory cells,
wherein another bit line of the first bit line pair is electrically connected to the second transistors of the D second memory cells,
wherein one bit line of the second bit line pair is electrically connected to the first transistors of the B first memory cells and the second transistors of the F second memory cells,
wherein another bit line of the second bit line pair is electrically connected to the first transistors of the C first memory cells and the second transistors of the E second memory cells,
wherein the first cell array and the second cell array overlap with each other, and
wherein a channel formation region of each of the first transistor and the second transistor comprises an oxide semiconductor.

2. The memory device according to claim 1, further comprising a plurality of the first bit line pairs and a plurality of the second bit line pairs, wherein the first bit line pairs and the second bit line pairs are alternately provided.

3. The memory device according to claim 1, wherein the D is more than or equal to 0.8 times and less than or equal to 1.2 times the A.

4. The memory device according to claim 1, wherein a sum of the C and the E is more than or equal to 0.8 times and less than or equal to 1.2 times a sum of the B and the F.

5. The memory device according to claim 1, wherein the second cell array is positioned over the first cell array.

6. The memory device according to claim 1,
wherein the first bit line pair is a parallel bit line pair, and
wherein the second bit line pair is a twisted bit line pair.

7. A memory device comprising:
a first cell array comprising A first memory cells, B first memory cells, and C first memory cells;
a second cell array comprising D second memory cells, E second memory cells, and F second memory cells; and
a first bit line pair and a second bit line pair,
wherein A, B, C, D, E, and F are integers greater than or equal to 1,
wherein one bit line of the first bit line pair is electrically connected to the A first memory cells,
wherein another bit line of the first bit line pair is electrically connected to the D second memory cells,
wherein one bit line of the second bit line pair is electrically connected to the B first memory cells and the F second memory cells,
wherein another bit line of the second bit line pair is electrically connected to the C first memory cells and the E second memory cells, and
wherein the first cell array and the second cell array overlap with each other.

8. The memory device according to claim 7, further comprising a plurality of the first bit line pairs and a plurality of the second bit line pairs,
wherein the first bit line pairs and the second bit line pairs are alternately provided.

9. The memory device according to claim 7, wherein the D is more than or equal to 0.8 times and less than or equal to 1.2 times the A.

10. The memory device according to claim 7, wherein a sum of the C and the E is more than or equal to 0.8 times and less than or equal to 1.2 times a sum of the B and the F.

11. The memory device according to claim 7, wherein the second cell array is positioned over the first cell array.

12. The memory device according to claim 7,
wherein the first bit line pair is a parallel bit line pair, and
wherein the second bit line pair is a twisted bit line pair.

* * * * *